(12) United States Patent
Frese et al.

(10) Patent No.: US 9,494,483 B2
(45) Date of Patent: Nov. 15, 2016

(54) MEASURING SYSTEM FOR MEASURING AN IMAGING QUALITY OF AN EUV LENS

(71) Applicant: Carl Zeiss SMT GMBH, Oberkochen (DE)

(72) Inventors: Ralf Frese, Oberkochen (DE); Michael Samaniego, Ulm (DE);
(Continued)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/494,144

(22) Filed: Sep. 23, 2014

(65) Prior Publication Data

US 2015/0009492 A1    Jan. 8, 2015

Related U.S. Application Data

(63) Continuation of application No. PCT/EP2013/000875, filed on Mar. 22, 2013.
(Continued)

(30) Foreign Application Priority Data

Mar. 23, 2012  (DE) .................. 10 2012 204 704

(51) Int. Cl.
*G01J 1/42*    (2006.01)
*G01M 11/02*    (2006.01)
(Continued)

(52) U.S. Cl.
CPC ....... *G01M 11/0207* (2013.01); *G01M 11/005* (2013.01); *G03F 7/706* (2013.01)

(58) Field of Classification Search
CPC ............. G01M 11/0207; G01M 11/005; G03F 7/706
(Continued)

(56) References Cited

U.S. PATENT DOCUMENTS 6,693,704 B1    2/2004  Ooki et al.
6,833,906 B1   12/2004  Ohsaki
(Continued)

FOREIGN PATENT DOCUMENTS

CN    101013195 A    8/2007
CN    101512309 A    8/2009
(Continued)

OTHER PUBLICATIONS

Office Action in corresponding German Application No. 10 2012 204 704.2, dated Mar. 22, 2013, along with an English translation.
(Continued)

*Primary Examiner* — David Porta
*Assistant Examiner* — Meenakshi Sahu
(74) *Attorney, Agent, or Firm* — Edell, Shapiro & Finnan, LLC

(57) ABSTRACT

A measuring system (10) for measuring an imaging quality of an EUV lens (30) includes a diffractive test structure (26), a measurement light radiating device (16) which is configured to radiate measurement light (21) in the EUV wavelength range onto the test structure, a variation device (28) for varying at least one image-determining parameter of an imaging of the test structure that is effected by a lens, a detector (14) for recording an image stack including a plurality of images generated with different image-determining parameters being set, and an evaluation device (15) which is configured to determine the imaging quality of the lens from the image stack.

24 Claims, 22 Drawing Sheets

(72) Inventors: Markus Deguenther, Aalen (DE); Helmut Haidner, Aalen (DE); Rainer Hoch, Aalen (DE); Martin Schriever, Aalen (DE)

Related U.S. Application Data

(60) Provisional application No. 61/614,759, filed on Mar. 23, 2012.

(51) Int. Cl.
*G01M 11/00* (2006.01)
*G03F 7/20* (2006.01)

(58) Field of Classification Search
USPC ........................................................ 250/372
See application file for complete search history.

(56) References Cited

U.S. PATENT DOCUMENTS

| | | | |
|---|---|---|---|
| 6,906,839 B2 | 6/2005 | Gerchberg | |
| 6,987,255 B2 | 1/2006 | Smith | |
| 7,623,251 B2 | 11/2009 | Neal et al. | |
| 7,635,832 B2 | 12/2009 | Dean | |
| 7,864,333 B1 | 1/2011 | Olczak et al. | |
| 2003/0210388 A1 | 11/2003 | Sasaki | |
| 2004/0052426 A1 | 3/2004 | Landesman | |
| 2005/0117148 A1* | 6/2005 | Dirksen | G03F 7/7085 356/124 |
| 2005/0206850 A1* | 9/2005 | Shimizu | G03B 21/18 353/55 |
| 2006/0072104 A1 | 4/2006 | Engel et al. | |
| 2006/0109533 A1* | 5/2006 | Schriever | G01J 9/02 359/15 |
| 2008/0128643 A1 | 6/2008 | Mueller et al. | |
| 2010/0177320 A1* | 7/2010 | Arnold | G01B 9/021 356/512 |
| 2010/0256967 A1 | 10/2010 | Smith et al. | |
| 2011/0054693 A1 | 3/2011 | Dean | |
| 2011/0194120 A1 | 8/2011 | Amaratunga et al. | |

FOREIGN PATENT DOCUMENTS

| | | |
|---|---|---|
| CN | 101893485 A | 11/2010 |
| CN | 102147530 A | 8/2011 |
| DE | 10131534 A1 | 1/2003 |
| DE | 10327019 A1 | 12/2004 |
| DE | 10335982 A1 | 3/2005 |
| DE | 102006030670 A1 | 1/2008 |
| DE | 102007043635 A1 | 3/2008 |
| EP | 2207063 A1 | 7/2010 |
| GB | 2474442 A | 4/2011 |
| JP | H10284368 A | 10/1998 |
| JP | 2000294488 A | 10/2000 |
| JP | 2000340488 A | 12/2000 |
| JP | 2006303302 A | 11/2006 |
| JP | 2007303907 A | 11/2007 |
| JP | 2007329281 A | 12/2007 |
| WO | 2008025433 A2 | 3/2008 |
| WO | 2009058747 A1 | 5/2009 |

OTHER PUBLICATIONS

International Search Report and Written Opinion in counterpart International Application No. PCT/EP2013/000875, mailed Nov. 6, 2013.
"X-Ray Interactions With Matter", downloaded on Mar. 16, 2012, http://henke.lbl.gov/optical_constants.

* cited by examiner

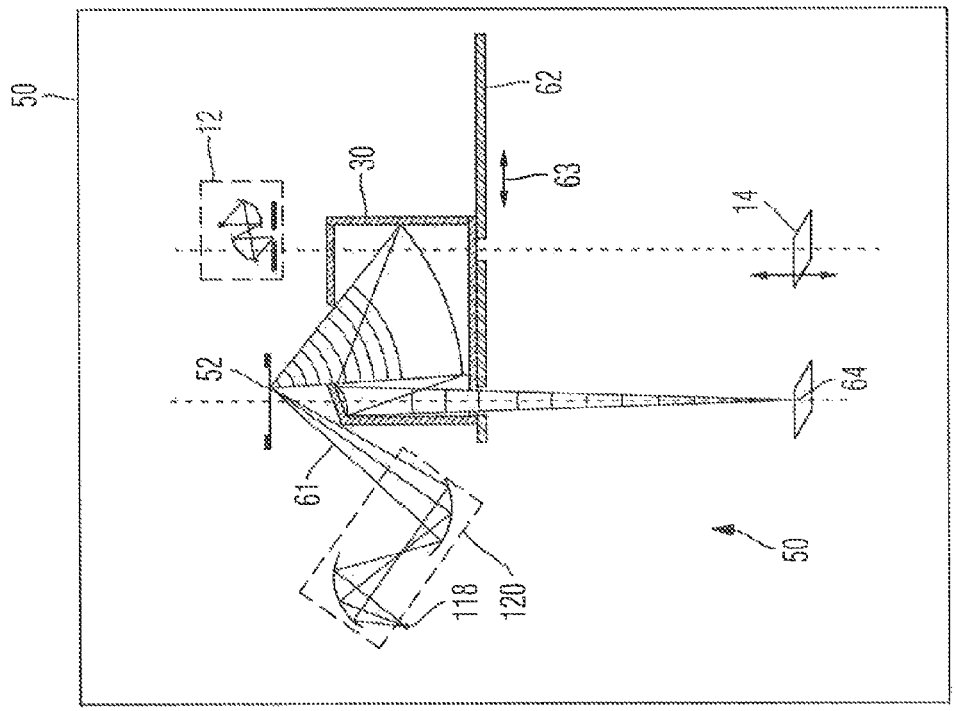
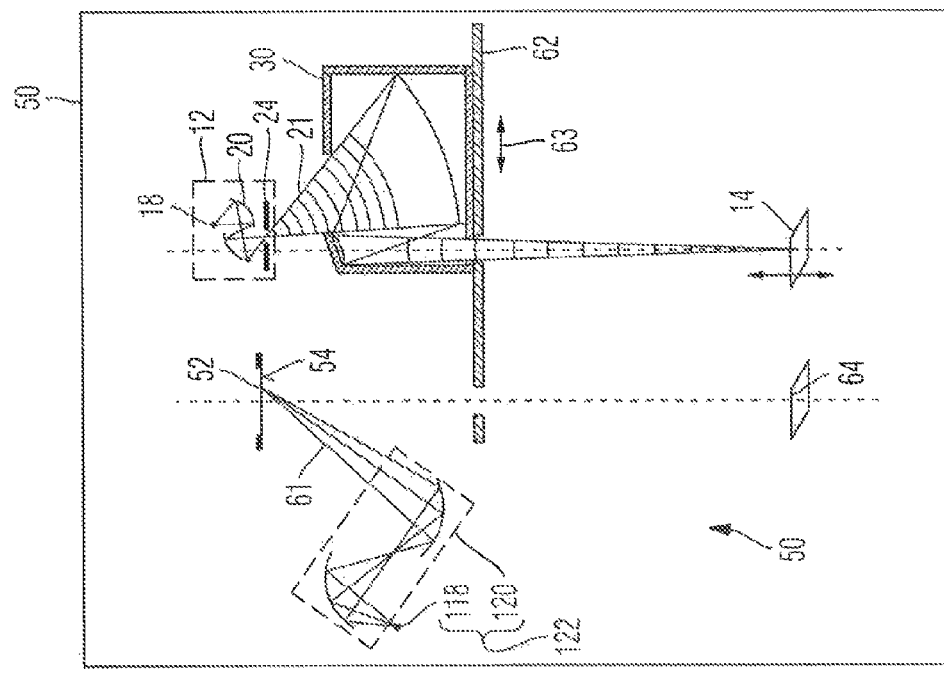
Fig. 4A
Fig. 4B

MEASURING SYSTEM FOR MEASURING AN IMAGING QUALITY OF AN EUV LENS

CROSS-REFERENCE TO RELATED APPLICATIONS

This is a Continuation of International Application PCT/ 2013/000875, with an international filing date of Mar. 22, 2013, which was published under PCT Article 21(2) in English, and the complete disclosure of which is incorporated into this application by reference. This Application claims priority to German Patent Application No. 10 2012 204 704.2 filed on Mar. 23, 2012 and to U.S. Provisional Application No. 61/614,759, also filed on Mar. 23, 2012. The entire disclosures of this German patent application, and this U.S. Provisional Application are incorporated into the present application by reference.

FIELD OF AND BACKGROUND OF THE INVENTION

The invention relates to a measuring system for measuring an imaging quality of an EUV lens, an arrangement comprising an EUV lens for an inspection apparatus and a measuring system of the aforementioned type, an inspection apparatus for inspecting a surface of a substrate for microlithography, and a method for measuring an imaging quality of an EUV lens.

The measurement of wavefront aberrations for EUV lenses at the operating wavelength thereof is a crucial factor for qualification and ensuring the performance thereof. Existing solutions are optimized for systems having a reduction factor of 4:1. The need for EUV inspection optical units in the semiconductor industry pushes optical designs having a high magnification scale. On account of this magnification, interferometric measuring methods for EUV lithography optical units can achieve the required measurement accuracy only with difficulty.

Therefore, there is a need for non-interferometric measuring techniques for magnifying EUV lenses such as are required for inspection apparatuses for mask or wafer inspection which achieve the required measurement accuracy.

In order to obtain highly accurate measurement results, a wavefront source having high spatial resolution is required in order that the pupil is filled by diffraction. At wavelengths of greater than 100 nm, materials such as metals, for example, exhibit a distinct optical effect in the case of layer thicknesses below the wavelength. Only materials having small differences in the complex refractive index can be used in EUV applications. Therefore, diffractive structures have a non-negligible vertical extent which has to be taken into account in the description of the measurement. A non-optimized wavefront source, on account of its topography, can introduce artificial wavefront aberrations into the metrology system.

OBJECTS AND SUMMARY OF THE INVENTION

It is an object of the invention to provide a measuring system and a method of the type mentioned above whereby the abovementioned problems are solved, and, in particular, a measurement of EUV lenses having a high magnification scale is made possible with high measurement accuracy.

The aforementioned object can be achieved according to a first aspect of the invention, for example, by a measuring system for measuring an imaging quality of an EUV lens, which measuring system comprises a diffractive test structure. Furthermore, the measuring system comprises a measurement light radiating device which is configured to radiate measurement light in the EUV wavelength range onto the test structure, a variation device for varying at least one image-determining parameter of an imaging of the test structure that is effected by the lens, a detector for recording an image stack comprising a plurality of images generated with different image-determining parameters being set, and an evaluation device which is configured to determine the imaging quality of the lens from the image stack.

The test structure is a diffractive structure, meaning that diffraction effects are significant in the interaction of measurement light with the diffractive test structure. According to an embodiment the diffractive test structure is dimensioned smaller than five times, in particular two times of the Airy diameter of the measurement light. The Airy diameter is defined as 1.22 times the quotient of the wavelength of the measurement light and the numerical aperture of the lens. The test structure can be a diffractive structure, such as e.g. a pinhole or an edge mask, etc., which diffracts the measurement light in such a way that the measurement light is radiated onto the lens with a wavefront having the shape of a conic section in cross section. However, the wavefront shape is not restricted to shapes having a conic-section cross section. The wavefront radiated onto the lens is advantageously a spherical wavefront. For this purpose, the test structure is advantageously configured in such a way that it is below the resolution limit of the lens. According to an embodiment the diffractive test structure is configured such that the measurement light after interaction with the diffractive test structure has a wavefront which has a maximum deviation of 0.1 nm or less from a target shape, e.g. from an ideal shape of a conic section, in particular from a sphere. In different words, the wavefront of the wave produced by the diffractive structure is very well defined.

The imaging of the test structure can be effected in transmission or reflection. The evaluation effected by the evaluation device is effected, in particular, on the basis of a method known to the person skilled in the art as "phase retrieval". The image-determining parameter to be varied can be the front focal length and/or back focal length. For variation purposes, it is possible to vary the position of the test structure and/or of the detector parallel to the optical axis of the lens.

In accordance with one embodiment according to the invention, the test structure is part of a test mask having a reflective effect with respect to the measurement light and, in particular, the test mask has a multilayer arrangement.

In accordance with a further embodiment according to the invention, the test structure is embodied in an absorption layer applied on the multilayer arrangement.

In accordance with a further embodiment according to the invention, the test structure is formed by the multilayer arrangement applied on a non-reflective carrier. According to a further embodiment of the invention the diffractive test structure is part of a test mask and the measurement light radiation device is configured to radiate the measurement light at grazing incidence onto the test mask. Hereby, the measurement light is radiated at a small incidence angle, i.e. an angle close to parallel to the surface of the test mask, onto the test mask. The incident angle is chosen such that the reflectivity of the surface material of the test mask becomes significantly larger compared to larger angles of incidence.

According to a further embodiment the diffractive test structure is formed by an insert of a material of high reflectivity at grazing incidence contained in a recess of a carrier layer of lower reflectivity at grazing incidence.

According to a further embodiment the diffractive test structure is formed by a pad made of a material of high reflectivity at grazing incidence, which pad is arranged on a surface of a carrier layer of lower reflectivity at grazing incidence.

According to a further embodiment the diffractive test structure is formed by a cutout in a layer of low reflectivity at grazing incidence arranged on top of a carrier layer of higher reflectivity at grazing incidence.

According to a further embodiment the diffractive test structure has an elongate shape, in particular an elliptical shape.

In accordance with a further embodiment according to the invention, the measuring system comprises a test mask having the test structure in the form of a cutout and an illumination cutout offset with respect to the hole structure, wherein a reflective element is arranged at the opposite side of the test mask relative to the measurement light radiating device, said reflective element being configured to direct the measurement light through the cutout of the test structure after said light has passed through the illumination cutout. For this purpose the reflective element is at a certain distance from the test mask. In accordance with one variation according to the invention, the reflective element is embodied to act in a focusing fashion with respect to the measurement light.

In accordance with a further embodiment according to the invention, the cutout of the test structure is embodied with beveled wall surfaces. In this case, the wall surfaces are beveled with respect to conventional wall surfaces embodied perpendicular to the mask surface. In accordance with one variation, the beveled wall surfaces are oriented parallel to the direction of propagation of the measurement light passing through the test structure.

In accordance with a further embodiment according to the invention, two further reflective elements are arranged at the opposite side of the test mask relative to the measurement light radiating device in such a way that the measurement light, after passing through the illumination cutout, is additionally deflected at the two further reflective elements before it passes through the cutout of the test structure. In accordance with one variation, one of the further reflective elements is embodied as a reflective surface on the test mask. In accordance with a further variation, a first reflective element is embodied as a focusing element, either as first element in the beam path of the measurement radiation after passing through the illumination cutout or as last element.

In accordance with a further embodiment according to the invention, the reflective elements are arranged in such a way that the beam path of the measurement light between passing through the illumination cutout and passing through the cutout of the test structure intersects twice. In accordance with this embodiment, the measurement light radiating device does not have to be adjusted between inspection operation and measuring operation.

In accordance with a further embodiment according to the invention, the reflective element is embodied as a diffusing plate.

In accordance with a further embodiment according to the invention, the test mask is provided with an antireflection coating on its side facing the measurement light radiating device. The antireflection coating can be embodied as a multilayer arrangement.

In accordance with a further embodiment according to the invention, the test mask has, on its side facing the measurement light radiating device around the test structure, a surface region which runs obliquely at least in sections with respect to that side of the test mask which faces away from the measurement light radiating device. In accordance with one variation, the oblique course of the surface region around the test structure is brought about by a thickness variation of an absorption layer of the test mask.

In accordance with a further variation, the test mask comprises an absorption layer applied on a carrier layer and the oblique profile of the surface region around the test structure is brought about by a thickness variation of the carrier layer.

In accordance with a further embodiment according to the invention, the test mask is furthermore provided with a reflective coating, in particular a reflective multiple coating, on its side opposite to the measurement light radiating device.

In accordance with a further embodiment according to the invention, the test mask and the reflective element are part of a mask module having the dimensions of a product reticle configured for exposure in an EUV projection exposure apparatus. Furthermore, the mask module has approximately the weight of such a product reticle.

In accordance with a further embodiment according to the invention, the evaluation device is configured to take account of an angle dependence of the reflection properties of the multilayer arrangement when determining the imaging quality of the lens. In accordance with one variant, the influences of the reflection properties on the measurement result are removed by calculation from the apodization.

In accordance with a further embodiment according to the invention, the test structure is embodied as a hole structure and the evaluation device is configured to determine, for the dimensioning of the hole structure, a value deviating from the real dimensioning through optimization calculation when determining the imaging quality of the lens.

In accordance with a further embodiment according to the invention, the evaluation device is configured to extend the capture range of the measurement by determining the caustic curve of the image of the test structure. The caustic curve is determined by evaluating the image stack.

In accordance with a further embodiment according to the invention, the evaluation device is configured to extend the capture range of the measurement by determining the caustic curve of an image of a capture structure that is comparatively large relative to the test structure through Radon transformation.

In accordance with a further embodiment according to the invention, the measuring system comprises a test mask having test structures arranged at a plurality of field points and the evaluation device is configured to determine the imaging quality simultaneously at a plurality of field points.

In accordance with a further embodiment according to the invention the measuring system further comprises a correction plate arranged in a beam path of the measurement light downstream of an interaction of the measurement light with the diffractive test structure, which correction plate is configured to have an optical effect on the measurement light, which optical effect varies in a direction transverse to a propagation direction of the measurement light at the correction plate. In other words a test wave may be generated by diffraction of the measurement light at the test structure and the correction plate is arranged in the beam path of the test wave.

According to a further embodiment the correction plate is configured to transmit the measurement light. In accordance with a variation according to the invention the correction plate comprises a transmissive layer having a varying thickness.

According to a further embodiment the varying optical effect of the correction plate comprises a varying phase shift effect, which is effected in the measurement light when interacting with the correction plate. This may e.g. be implemented by configuring the correction plate to comprise a transmissive layer having varying thickness.

According to a further embodiment the varying optical effect comprises a varying intensity attenuation, which is effected in the measurement light when interacting with the correction plate. For example, the correction plate comprises a transmissive layer having a varying absorption coefficient and/or a varying thickness.

According to a further embodiment the varying optical effect comprises both a varying phase shift effect and a varying intensity attenuation effect respectively effected in the measurement light when interacting with the correction plate. This may for example be implemented by configuring the correction plate to comprise two transmissive layers having different refractive indexes, wherein each layer has a respective suitable thickness variation transverse to the propagation direction of the measurement light at the correction plate.

According to a further embodiment the correction plate is arranged in the far field of a test wave generated by diffraction of the measurement light at the test structure. The term "far field" in this context refers to a distance d from the diffractive test structure, at which the test wave is generated, for which distance d the Fresnel-number is smaller than one. The Fresnel number F is defined in the subsequent portion of the specification relating to the figures.

According to different embodiments the test structure may be part of a reflective mask, or a transmissive mask.

According to a further embodiment the correction plate is arranged in the near field of a test wave generated by diffraction of the measurement light at the test structure. The term "near field" in this context refers to a distance d from the diffractive test structure, at which the test wave is generated, for which distance d the Fresnel number is larger than one. An example of an arrangement in the near field includes an arrangement in which the correction plate is attached directly to a test mask comprising the diffractive test structure. In this case the distance d is zero.

Furthermore, the invention provides an arrangement comprising a lens, in particular an EUV lens, for an inspection apparatus and comprising a measuring system in one of the above-described embodiments for measuring the lens.

Furthermore, the invention provides an inspection apparatus for inspecting a surface of a substrate for microlithography, which inspection apparatus comprises a lens, in particular an EUV lens, for imaging at least one section of a surface to be inspected of a substrate into a detection plane an imaging radiation, in particular in the EUV wavelength range, and comprises a measuring system in one of the above-described embodiments for measuring an imaging quality of the lens. The substrate can be, for example, a product mask for microlithography or a wafer for microlithography.

In accordance with a further embodiment according to the invention, the inspection apparatus has an object holder for holding the substrate to be inspected, wherein the test structure is arranged on the object holder and the object holder is mounted such that it is displaceable between an inspection position, in which the substrate to be inspected is arranged in the beam path of the measurement light, and a measurement position, in which the test structure is arranged in the beam path of the measurement light.

In accordance with a further embodiment according to the invention, the inspection apparatus has, in addition to the measurement light radiating device, an inspection light radiating device for radiating inspection light onto the substrate to be inspected. Furthermore, the lens is arranged on a displacing table, with which the lens can be shifted between an inspection position, in which the lens is arranged in the beam path of the inspection light after interaction with the substrate, and a measurement position, in which the lens is arranged in the beam path of the measurement light after interaction with the test structure. In accordance with one variant, the inspection apparatus has, in addition to the detector of the measuring system, an inspection detector which is positioned in the beam path of the inspection light when the lens is arranged in the inspection position. In accordance with a further variant, the detector of the measuring system is arranged in the beam path of the measurement light when the lens is arranged in the measurement position.

In accordance with a further embodiment according to the invention, the lens has a first incidence window for radiating in the measurement light for inspecting the substrate surface and a second incidence window for radiating in the measurement light for measuring the imaging quality.

In accordance with a further embodiment according to the invention, the test structure is integrated into the first incidence window.

In accordance with a further embodiment according to the invention, at least one optical element of the lens is mounted in an adjustable fashion in such a way that the input beam path of the lens is variable between the two incidence windows in such a way that the output beam path of the lens remains substantially unchanged.

In accordance with a further embodiment according to the invention, the measurement light radiating device has at least one optical element mounted in an adjustable fashion in such a way that the incidence of the measurement light can be varied between the two incidence windows.

Furthermore, according to the first aspect of the invention a method for measuring an imaging quality of an EUV lens is provided, which method comprises the following steps: radiating measurement light in the EUV wavelength range onto a diffractive test structure, imaging the test structure with the lens onto a detector whilst varying at least one image-determining parameter of the imaging, recording an image stack generated by the variation of the image-determining parameter, and determining the imaging quality of the lens by evaluating the image stack.

In accordance with one embodiment, the method according to the first aspect of the invention is carried out using the measuring system in one of the above-described embodiments or using the inspection apparatus in one of the above-described embodiments.

The features specified with regard to the abovementioned embodiments of the measuring system according to the invention and/or of the inspection apparatus according to the invention can be correspondingly applied to the method according to the invention. Conversely, the features specified with regard to the abovementioned embodiments of the method according to the invention can be correspondingly applied to the measuring system according to the invention and/or the inspection apparatus according to the invention.

According to a second aspect of the invention a measuring system for measuring an imaging quality of a lens is provided. The measuring system comprises: a lens holder for holding the lens, a measurement light radiation device configured to produce measurement light, a first diffractive test structure arranged on an object side of the lens when arranged in the lens holder such that a test wave is generated by diffraction of the measurement light at the first diffractive test structure, a second diffractive test structure arranged on an image side of the lens when arranged in the lens holder such that a reference wave is generated by diffraction of the measurement light at the second diffractive test structure, and a detector arranged to record an interference pattern generated by superposition of light from the test wave having interacted with the lens and light from the reference wave.

The lens to be tested using the measuring system according to the second aspect of the invention may be an EUV lens. In this case the measurement light radiation device is configured to produce measurement light in the EUV wavelength range. The test wave generated by the first diffractive test structure may be an expanding wave. According to an embodiment the measurement system further comprises an evaluation device configured to determine the imaging quality of the lens from the interference pattern recorded by the detector.

By providing two diffractive test structure arranged on opposite sides of the lens to be tested, namely one on the object side and one on the image side of the lens, two waves can be produced having an "optimized" wavefront, i.e. a wavefront adapted to a desired wavefront, e.g. a spherical wavefront, very precisely. The first wave having an "optimized" wavefront, designated "test wave", is generated on the object side of the lens. When interacting with the lens the test wave accumulates aberrations from the lens. The second "optimized" wavefront, designated "reference wave" is generated on the image side of the lens using the second diffractive test structure. As wavefront optimization of the reference wave is performed on the image side of the lens the reference wave does not have the aberrations accumulated from interaction with the lens, which are superimposed on the wavefront of the test wave. Therefore an evaluation of the interference pattern recorded by the detector generated by superposition of light from the test wave having interacted with the lens and light from the reference wave allows an imaging quality, in particular the wavefront aberrations, of the lens to be determined.

According to an embodiment of the measurement system according to the second aspect of the invention further a reference beam generating structure is arranged on the object side of the lens when arranged in the lens holder, which reference beam generating structure is configured to form a reference beam from the measurement light and direct the reference beam onto the second diffractive test structure. The reference beam is, in particular, directed at the second diffractive test structure after having interacted with the EUV lens.

According to a variation the reference beam generating structure is provided in form of a free aperture having a diameter larger than twenty times the Airy diameter of the measurement light, as defined above. The reference beam generating structure and the first diffractive test structure may be part of an object side mask arranged on the object side of the EUV lens. The second diffractive test structure is according to a variation arranged on an image side mask, which further comprises a free aperture configured to allow the test wave pass through to the detector without imposing diffraction effects on the test wave.

According to a further embodiment of the measurement system according to the second aspect of the invention a diffraction grating is arranged in the beam path of the test wave such that the test wave is split up into differently oriented beams, wherein a first one of the beams is directed onto the second diffractive structure and a second one of the beams is directed onto the detector to generate the interference pattern by superposition with the reference wave.

According to a further embodiment of the measurement system according to the second aspect of the invention the second diffractive test structure is configured as a light absorbing structure in a light reflecting background and the detector is arranged on the object side of the lens when arranged in the lens holder.

According to a further embodiment according to the second aspect of the invention the measuring system is configured such that, with the lens arranged in the lens holder, the interference pattern is generated by superposition of light from the test wave having traversed the lens two times and light from the reference wave having traversed the lens one time after generation of the reference wave at the second diffractive structure.

Further, according to the second aspect of the invention a method for measuring an image quality of a lens is provided, which method comprises the following steps: producing measurement light, arranging a first diffractive test structure on an object side of the lens and generating a test wave by diffraction of the measurement light at the first diffractive test structure, arranging a second diffractive test structure on an image side of the lens and generating a reference wave by diffraction of the measurement light at the second diffractive test structure, and recording an interference pattern generated by superposition of light from the test wave having interacted with the lens and light from the reference wave. The features specified with regard to the abovementioned embodiments of the measuring system according to the second aspect of the invention can be correspondingly applied to the above method according to the second aspect of the invention.

Further features specified with regard to the abovementioned embodiments of the measuring system and the method according to the first aspect of the invention can be correspondingly applied to the above measuring system and the above method according to the second aspect of the invention.

According to a third aspect of the invention a method for measuring an imaging quality of a lens is provided. The method comprises the following steps: radiating measurement light onto a diffractive test structure such that a test wave is generated by diffraction of the measurement light at the diffractive test structure, arranging the lens having a pupil plane in the beam path of the test wave, modulating the light intensity of the test wave at the pupil plane such that the light intensity distribution of the measurement light after having passed through the pupil plane has external values at several test locations, arranging a detector on an image side of the lens and recording an intensity pattern produced by the test wave having passed through the lens, and determining the imaging quality of the lens by comparing the recorded intensity pattern with a predetermined target pattern. The lens subject to test may be an EUV lens. In this case the measurement light is light in EUV wavelength range. The detector is preferably configured as a two dimensionally resolving detector.

By generating a test wave using a diffractive test structure a wave having an "optimized" wave front is provided, i.e. a wave having a wavefront adapted to a desired wavefront, e.g. a spherical wavefront, very precisely. The provision of such an "optimized" test wave irradiated onto the lens to be tested together with a modulation of the light intensity at the pupil plane of the lens allows the influence of lens aberrations on the wavefront of the test wave after the later having passed through the lens to be determined very precisely. This way the imaging quality of the lens can be evaluated with high accuracy.

According to an embodiment of the measurement method according to the third aspect of the invention the light intensity is modulated by blocking the measurement light from passing through the pupil plane except at the test locations.

According to a further embodiment of the measurement method according to the third aspect of the invention the light intensity is modulated by arranging a diaphragm in the pupil plane having modulation structures arranged at the test locations and the detector is arranged in a position offset from a focal plane of the lens with respect to the imaging of the diffractive test structure. The focal plane with respect to the imaging of the diffractive test structure is the focal plane, which the test structure is imaged into. According to an alternative embodiment the light intensity is modulated by subsequently arranging different diaphragms, each having a modulation structure, e.g. a cutout, at a different location. In this case, the detector may be arranged in the focal plane. Modulation structures may be either transmissive regions, in particular cutouts, in an opaque environment or light blocking structures in a transmissive environment.

Further, according to the third aspect of the invention a measuring system for measuring an image quality of a lens is provided, which measuring system is configured to implement the above measuring method according to the third aspect of the invention in any of the described embodiments. Further features specified with regard to the abovementioned embodiments of the measuring system and the method according to the first aspect and/or the second aspect of the invention can be correspondingly applied to the above measuring method and the above measuring system according to the third aspect of the invention.

Furthermore, the invention provides a test mask for a measuring system for measuring an imaging quality of an EUV lens. Said test mask comprises a test structure configured to generate, upon irradiation with measurement light in the EUV wavelength range, a test wave whose wavefront has a maximum deviation of 0.1 nm or less from an ideal spherical shape. The test mask is configured, in particular, for use in the measuring system according to the invention in one of the above-described embodiments. Furthermore, the test mask can be configured in one of the embodiments of a test mask described in connection with the measuring system according to the invention.

The above described and other features of the embodiments according to the invention are explained in the claims and in the description of the figures. The individual features can be realized either separately or in combination as embodiments of the invention. Furthermore, they can describe advantageous embodiments which are independently protectable and protection for which is claimed, if appropriate, first during or after pendency of the application.

BRIEF DESCRIPTION OF THE DRAWINGS

The above and further advantageous features of the invention are illustrated in the following detailed description of exemplary embodiments according to the invention with reference to the accompanying schematic drawings, in which:

FIGS. 4A and 4B show a further embodiment according to the first aspect of the invention of an apparatus system, under 4A in a measurement position and under 4B in an inspection position.

DETAILED DESCRIPTION OF EXEMPLARY EMBODIMENTS

In the exemplary embodiments or embodiments described below, elements which are functionally or structurally similar to one another are as far as possible provided with the same or similar reference signs. Therefore, for understanding the features of the individual elements of a specific exemplary embodiment, reference should be made to the description of other exemplary embodiments or the general description of the invention.

Figure 1:
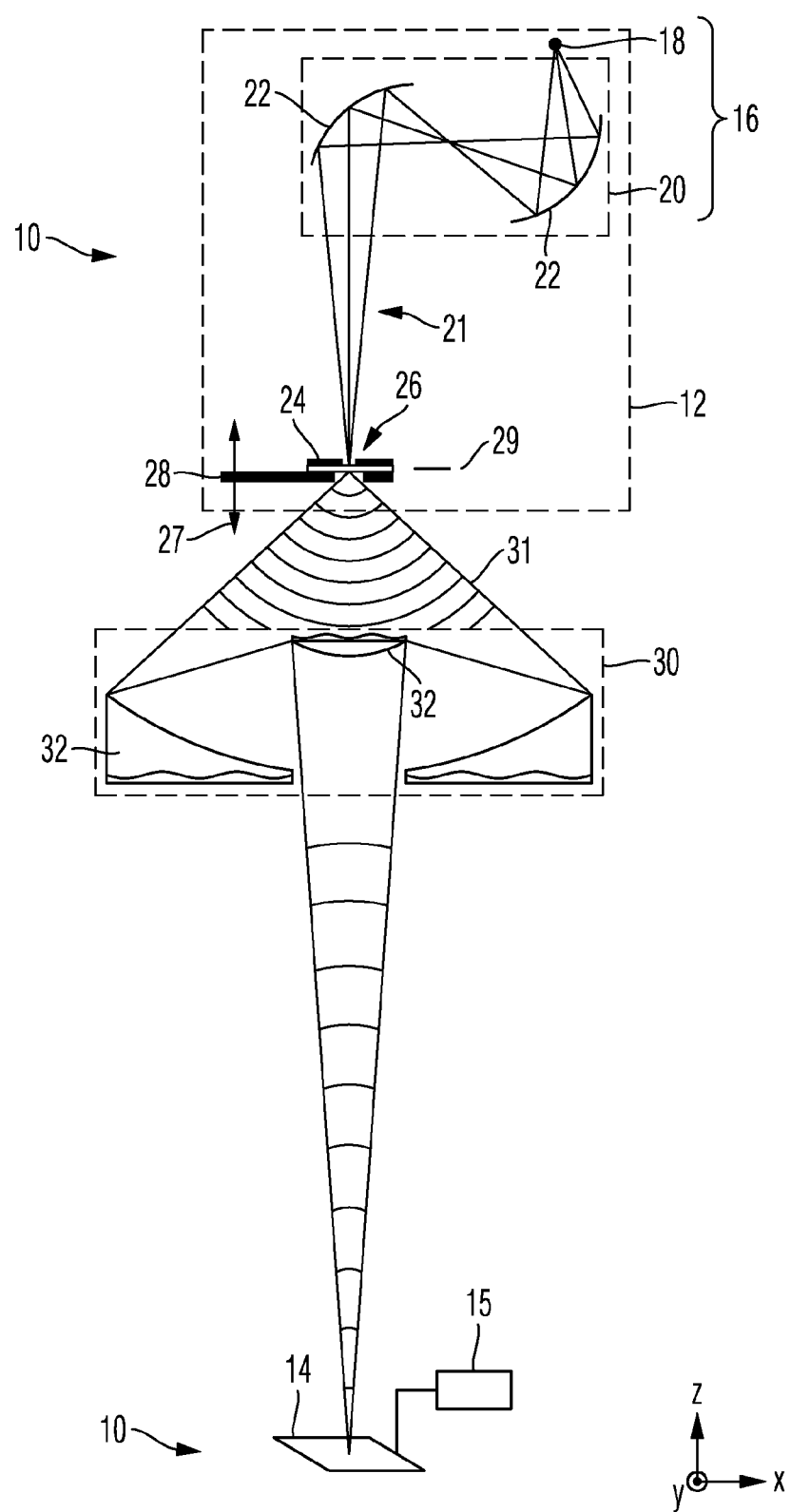
FIG. 1 shows an embodiment according to a first aspect of the invention of a measuring system for measuring an imaging quality of an EUV lens comprising a test structure arranged on a test mask.

To facilitate the description of the invention, a Cartesian xyz coordinate system is indicated in the drawing, which system reveals the respective positional relationship of the components illustrated in the figures. In FIG. 1, the y-direction runs perpendicularly to the plane of the drawing out of the latter, the x-direction runs toward the right and the z-direction runs upward.

FIGS. 1 to 22 illustrate embodiments relating to a first aspect of the invention. FIG. 1 illustrates an embodiment of a measuring system 10 according to a first aspect of the invention, which measuring system 10 is configured for measuring an imaging quality of an EUV lens 30. The EUV lens 30 is configured to image an object using radiation in the EUV wavelength range, that is to say using radiation having a wavelength of less than 100 nm, in particular a wavelength of approximately 13.5 nm or approximately 6.8 nm, from an object plane into an image plane. In FIG. 1, the EUV lens 30 is illustrated by way of example with two mirrors 32. However, it can also comprise a larger number of mirrors. Such an EUV lens 30 can be, for example, the lens of an inspection apparatus for inspecting a surface of a mask or of a wafer for microlithography. In the arrangement shown in FIG. 1, the EUV lens 30 is measured separately; in other figures shown subsequently, the EUV lens is measured in the state incorporated into an inspection system. The EUV lens to be measured is preferably configured as a magnifying imaging optical unit.

The measuring system 10 in accordance with FIG. 1 comprises a wavefront source 12, a two-dimensionally resolving detector 14 arranged in the image plane of the lens 30, and an evaluation device 15. The wavefront source 12 is an optical arrangement which produces a defined field distribution in the space and angle domain in the object plane of the lens 30. The wavefront source 12 comprises an EUV source 18 for generating measurement light 21 in the EUV wavelength range, that is to say having a wavelength of less than 100 nm, in particular of approximately 13.5 nm or approximately 6.8 nm. Furthermore, the wavefront source 12 comprises an illumination optical unit 20 having a plurality of mirrors 22, and a test mask 24 held by an object holder 28 in the object plane 29 of the lens 30. The test mask 24 is embodied as an amplitude mask operated in transmission. The EUV source 18 and the illumination optical unit 20 together form a measurement light radiating device 16. The measurement light 21 is radiated by the illumination optical unit 20 onto a test structure 26 in the form of a so-called "pinhole", said test structure being arranged on the test mask 24.

In other words, the wavefront source 12 can comprise a radiation emitter which may emit light at the operating wavelength of the lens 30, an imaging illumination optical unit 20 and an element in the form of a mask which modulates the field distribution in the space and/or angle domain in order to produce defined wave relationships. The illumination optical unit 20 comprises one or more optical elements and is configured to direct the emitted source power onto the mask and to adapt the illumination properties, that is to say intensity, field distribution, angle distribution, degree of coherence and spectral distribution. The illumination can be designed as follows: as Köhler illumination, as critical illumination, as parceled illumination optical unit with facet mirror or as illumination optical unit with homogenizing/mixing elements, e.g. a rod. Illumination, as used here, denotes the functional unit of all optical elements between source and mask. In the physical design, by contrast, optical elements which contribute, however, to the shaping of the illumination in terms of their functionality can be integrated as part of the mask.

The test structure 26 is configured to diffract the measurement light 21, to be precise in such a way that the measurement light 21 is radiated onto the lens 30 in form of a test wave 31 having a wavefront whose cross section has the shape of a conic section. Thus, the wavefront of the test wave 31 can be embodied e.g. as a spherical wavefront or as a cylindrical wavefront. In accordance with one embodiment, the wavefront of the measurement light 21 radiated onto the lens 30, also designated as test wave, is adapted to a spherical wavefront so precisely that the latter has a maximum deviation of 0.1 nm or less from an ideal spherical shape. For this purpose, the test structure 26 is advantageously configured such that it is below the resolution limit of the lens 30. Therefore test wave 31 radiated onto the lens 30 is also referred to as a "wavefront optimized" wave. The test structure 26 serves for producing a wavefront at a field point and is therefore also designated as wavefront-shaping element. The following structures can be used as test structure 26: a diffractive structure having an elliptical shape, in particular a circular shape, a diffractive structure having a rectangular shape, in particular a square shape, an edge mask having different edge orientations, a line mask having different edge orientations or a cluster of diffractive structures. A diffractive structure having a circular shape can be embodied e.g. as a so-called "pinhole" or hole structure.

The test mask 24 is an optical element which spatially modulates the incoming illumination distribution of the measurement light 21. The test mask 24 is designed such that, taking account of the illumination, a field distribution can be described by a numerical model on the detector 14. The mask can be realized for example in the following embodiments, as illustrated in part in the following figures: as a reflective amplitude mask, as a transmissive amplitude mask, as a reflective phase mask, as a transmissive phase mask, as a combination of a phase and amplitude mask in reflection or as a combination of a phase and amplitude mask in transmission.

In order to measure the imaging quality of the EUV lens 30, an image stack is recorded using the detector 14. Said image stack comprises a plurality of images of the test structure 26 which are generated on the detector 14 with variation of at least one image-determining parameter. Such an image-determining parameter to be varied can be, for example, the position of the test structure 26 and thus of the test mask 24 in the z-direction that is to say in the direction parallel to the optical axis of the lens 30, and/or the position of the detector likewise in the z-direction. As a result of such a variation, the focus setting is varied. In the embodiment illustrated in FIG. 1, the object holder 28 is mounted such that it is displaceable in the z-direction, as illustrated by the double-headed arrow 27, and thus forms a variation device for varying the focus setting. Alternatively, the focus setting can also be varied by displacing the detector 24 in the z-direction. In accordance with a further example of a variation of an image-determining parameter, a mask is arranged in the pupil of the lens 30 in different rotational positions.

In other words, the image stack is recorded at the operating wavelength of the EUV lens. The wavefront source is positioned in the object plane of the lens, and the detector is positioned in the image plane. The image stack is recorded by recording a plurality of field distributions with variation of at least one of the following variables: the back focal length by varying the position of the detector 14 in the z-direction, the front focal length by varying the distance between the wavefront source 12 and the lens 30, and the wavefront by changing a wavefront-shaping element, e.g. by introducing other structural shapes and/or orientations into the beam path of the measurement light 21.

The detector 14 has a spatial resolution which scans the diffraction image with a sufficient resolution. Detector 14 within the meaning of this application is understood to be a measuring device which records an electromagnetic field distribution in the detector plane at the operating wavelength of the lens 30 POB in a spatially resolved manner and converts it directly or indirectly into an electrical used signal. The use of EUV radiation as measurement light 21 requires a high spatial resolution of the detector 14. In order to be able to attain this resolution, in particular the following realizations of detectors are suitable: an EUV-sensitive CCD camera chip, a multi-channel plate, a convertor material for converting the photoelectrons, a photoelectron emission microscope, a single-channel raster with a diaphragm and photographic or resist images. With the use of an EUV-sensitive CCD camera chip or a multi-channel plate, the detector resolution can be increased through scanning in the sub-pixel range.

The recorded image stack is thereupon evaluated by an evaluation device 15. A suitable evaluation method is known to the person skilled in the art in connection with lenses in the visible wavelength range, e.g. from DE 103 27 019 A1 and also through the term "phase retrieval".

Figure 19:
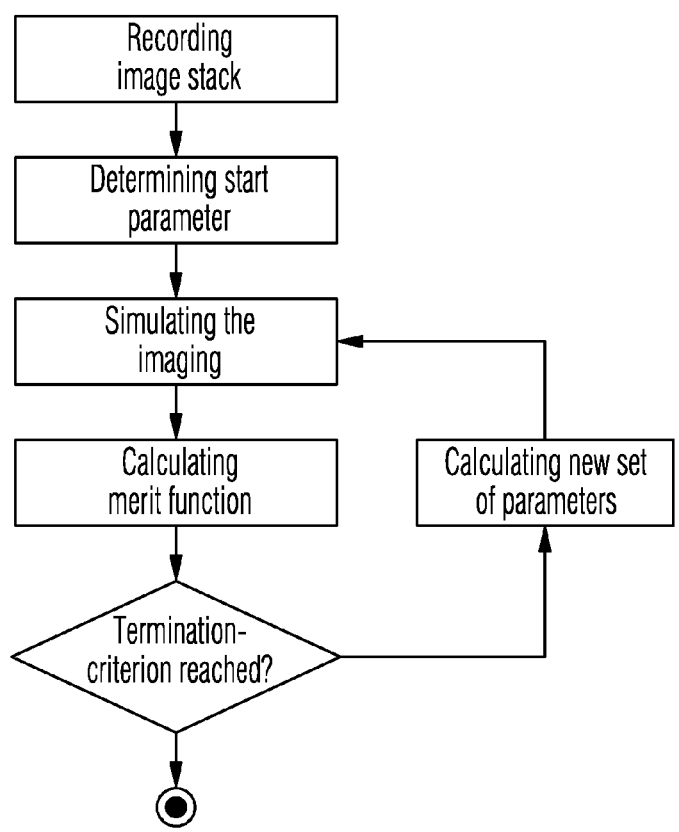
FIG. 19 shows a flow chart illustrating the basic principle of the evaluation method used by the measuring system according to the first aspect of the invention.

The principle of the evaluation method is illustrated in FIG. 19. The measurement sequence consists of three separate blocks. The first block comprises the physical recording of the measurement data. The second block is formed by a computing unit for simulating the image stack on the basis of a model of the measured lens 30. The third block comprises a unit for iterative optimization, that is to say a minimization of the differences between the measured image stack and the model proposition. The recorded image stack is compared with a generated image stack which was generated by a numerical model of the overall system, that is to say of the wavefront source 12, of the lens 30 and of the detector 14. The optimization is effected by repeated, that is to say iterative, adaptation of the model parameters, in particular of the wavefront aberrations.

As a result, the evaluation method carried out by the evaluation device 15 yields parameters which characterize the imaging quality of the EUV lens 30, such as, for instance, Zernike coefficients of the lens 30 which characterize wavefront aberrations.

Figure 2:
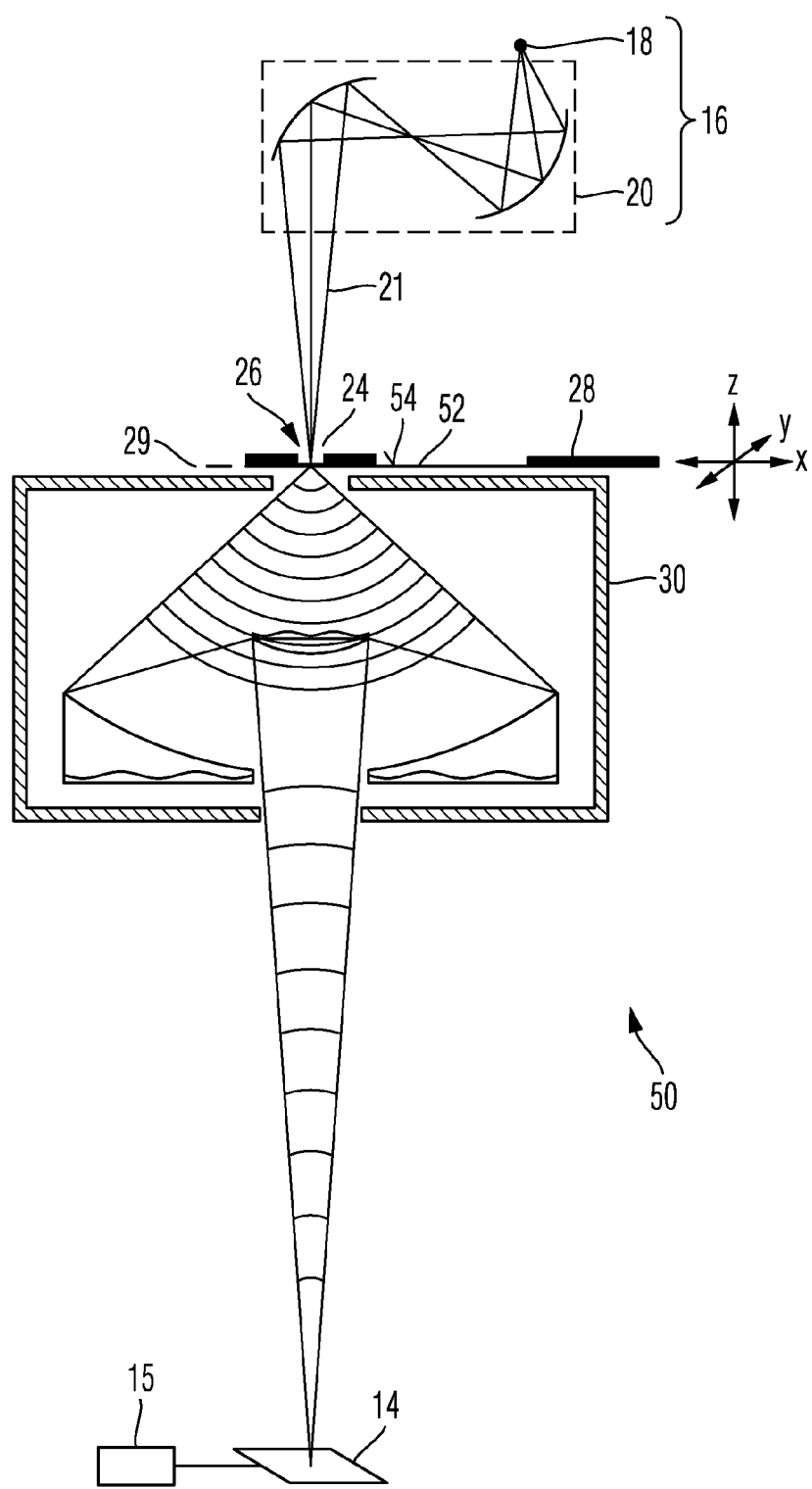
FIG. 2 shows an embodiment according to the first aspect of the invention of an inspection apparatus comprising a measuring apparatus integrated therein for measuring an imaging quality of an EUV lens of the inspection system.

FIG. 2 illustrates an inspection apparatus 50 for inspecting a surface 54 of a substrate 52 to be inspected in the form of a product mask for microlithography which is operated in transmission. The measuring system 10 known from FIG. 1 is integrated into this inspection apparatus 50. In the embodiment in accordance with FIG. 2, the corresponding modules of the inspection apparatus 50 can be used as measurement light radiating device 16 and as detector 14 for the imaging quality measurement. The object holder 28 in accordance with FIG. 2 is configured to receive the substrate 52 to be inspected. The test mask 24 having the test structure 26 is integrated in an edge region of the object holder 28. The object holder 28 is mounted such that it is displaceable in the object plane 29. Thus, the object holder 28 can be positioned in an inspection position, in which the substrate 52 to be inspected is arranged in the beam path of the measurement light 21, for carrying out an inspection of the substrate surface 54. Furthermore, the object holder 28 can be displaced into the measurement position illustrated in FIG. 2, in which the test mask 24 is arranged in the beam path of the measurement light 21. In this position, the measurement of the imaging quality of the lens 30 as explained with reference to FIG. 1 can already be effected.

In general terms, an integrated measuring technology for an overall apparatus containing the lens 30 is provided, which either is used as a metrological unit during operation or temporarily interrupts the application of the lens 30 in order to measure the aberrations thereof. The latter case can be realized by the following scenarios: mechanically introducing a wavefront source into the beam path, mechanically introducing an additional detector into the beam path, adapting the illumination to illuminate a designated test specimen or test area, introducing one or more optical units for folding the beam path, mechanically moving the lens 30 to a designated place for measurement within the application machine and/or altering the image or object deviation of the lens 30 by adjusting optical components of the lens 30 in interaction with a correction model describing the distortions of the altered lens 30.

Figure 3:
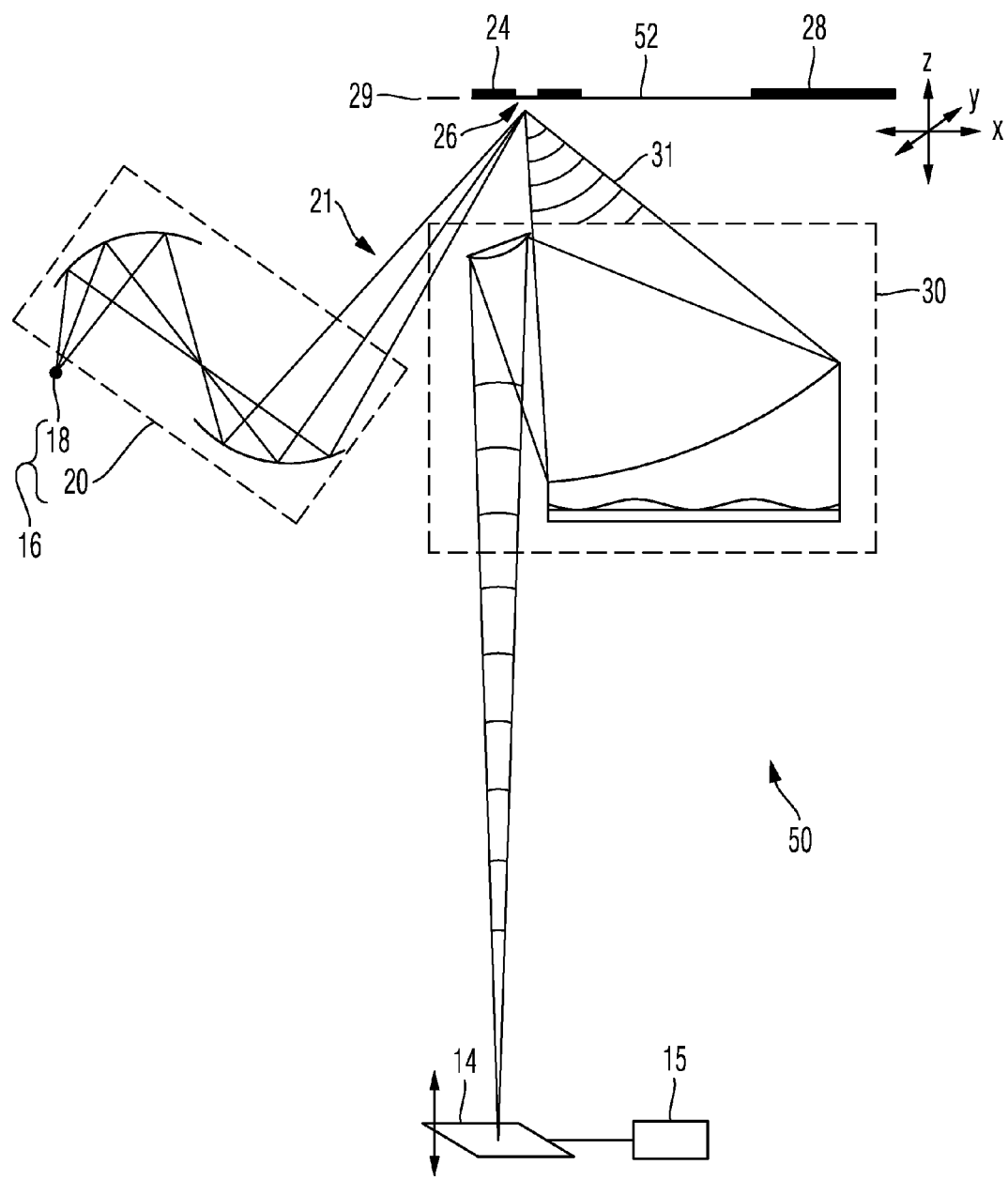
FIG. 3 shows a further embodiment according to the first aspect of the invention of an inspection system.

FIG. 3 shows a further embodiment of an inspection apparatus 50 comprising a measuring system integrated therein for measuring the imaging quality of the lens 30. This embodiment differs from the embodiment in accordance to FIG. 2 in that the inspection apparatus is configured here for inspecting a reflective substrate, such as, for instance, a mask operated in reflection or alternatively a wafer for microlithography. The measurement light radiating device 16 is arranged in such a way that the measurement light 21 is radiated onto the object plane 29 obliquely from below. The test mask 24 is likewise embodied as a reflective mask, as described in greater detail by way of example below.

In accordance with one exemplary embodiment, the inspection apparatus 50 in accordance with FIG. 3 has a numerical aperture of 0.0825. The operating wavelength is 13.5 nm. The chief ray angle of the lens 30 is 6° relative to the optical axis. The chief ray angle of the illumination is likewise 6°. Critical illumination is used with a circular illumination setting where σ=1. The magnification factor of the lens 30 is 850.

FIG. 4 shows a further embodiment of an inspection apparatus 50 comprising a measuring system integrated therein for measuring the imaging quality of the lens 30. This embodiment is configured for inspecting a reflective substrate 52, like the embodiment in accordance with FIG. 3. The inspection apparatus 50 in accordance with FIG. 4 has, besides the wavefront source 12, which comprises EUV source 18, the illumination optical unit 20 and the test mask 24, for carrying out the imaging quality measurement, an inspection light radiation device 122 comprising a further EUV source 118 and a further illumination optical unit 120 for inspecting the surface 24 of the substrate 52 to be inspected. FIG. 4 shows the inspection apparatus 50 under FIG. 4A in a measurement position and under FIG. 4B in an inspection position.

In order to change over between the two positions, the lens 30 is arranged on a transfer apparatus in the form of a displacement table 62, with which the lens can be displaced transversely with respect to the optical axis of the lens 30, as illustrated by the double-headed arrow 63. In the measurement position, the lens 30 is arranged below the wavefront source 12. In the inspection position, the lens 30 is arranged below the substrate 52 to be inspected, which is irradiated with inspection light 61 by the further illumination optical unit 120. The imaging of the substrate surface 54 is detected in the inspection position by a dedicated inspection detector 64.

Figures 5A, 5B:
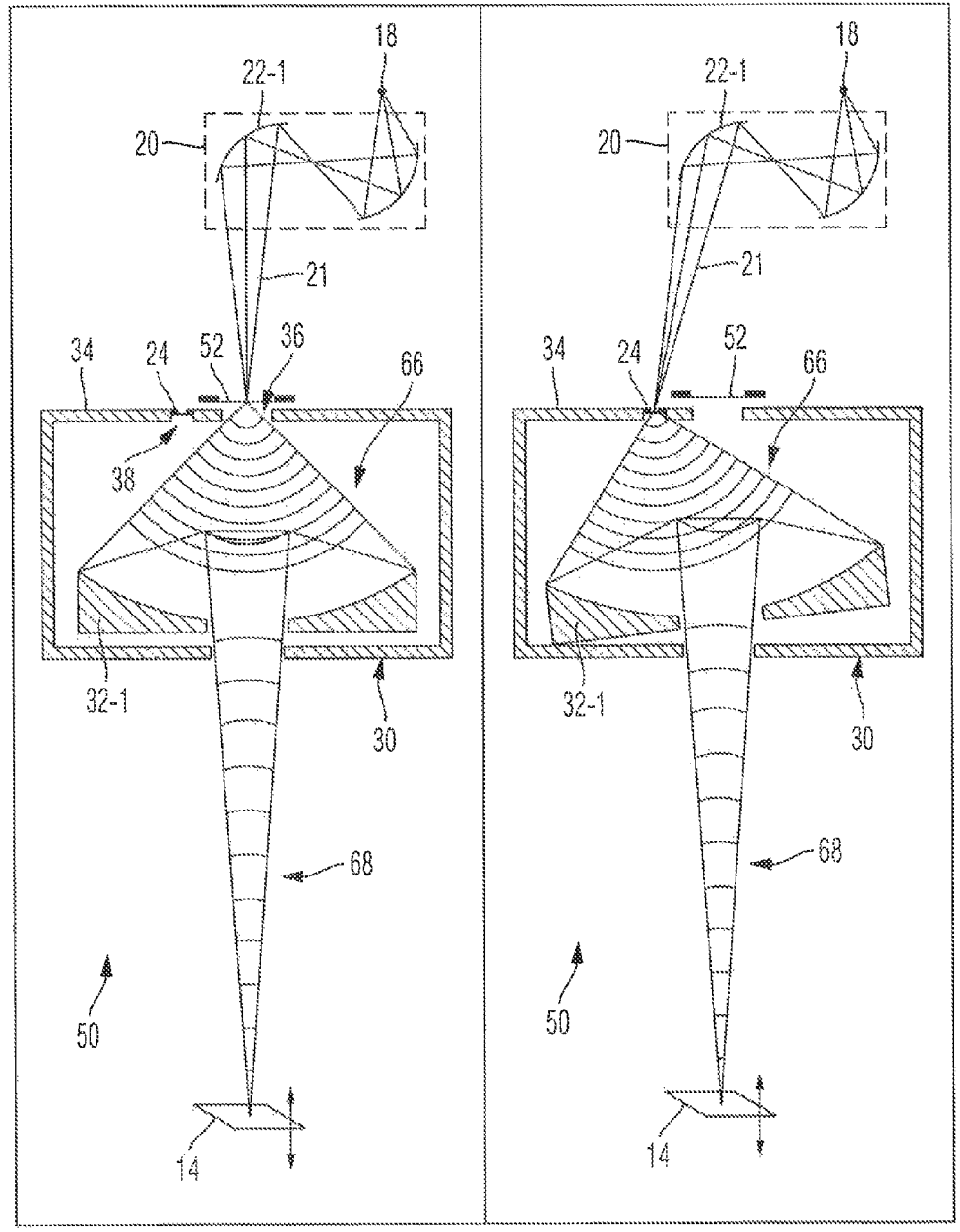
FIGS. 5A and 5B show a further embodiment according to the first aspect of the invention of an inspection apparatus, under 5A in an inspection position and under 5B in a measurement position.

FIG. 5 shows a further embodiment of an inspection apparatus 50 comprising a measuring system integrated therein for measuring the imaging quality of the lens 30, under FIG. 5A in an inspection position and under FIG. 5B in a measurement position. This embodiment is configured for inspecting a substrate 52 operated in transmission, like the embodiment in accordance with FIG. 2. The embodiment in accordance with FIG. 5 differs from the embodiment in accordance with FIG. 2 in the following points: a housing 34 of the lens 30 has, besides a first incidence window 36 for radiating in the measurement light 21 in the inspection position, in addition a second incidence window 38 for radiating in the measurement light 21 in the measurement position. The substrate 52 to be inspected is arranged in front of the first incidence window 36, while the test mask 24 is integrated into the second incidence window 38. The illumination optical unit 20 has an adjustable mirror 22-1, which can be tilted in such a way that the measurement light 21 is radiated either onto the first incidence window 36 or the second incidence window 38. The lens 30 has an adjustable mirror 32-1, which can be tilted in such a way that the input beam path 66 can be varied between the two incidence windows 36 and 38, in which case the output beam path 68 of the lens 30 remains unchanged. Thus, in the measurement position, in which the measurement light 21 is radiated onto the second incidence window 38, the adjustable mirror 32-1 can be tilted in such a way that the test mask 24 is imaged onto the detector 14, the position of which remains unchanged.

Figure 6:
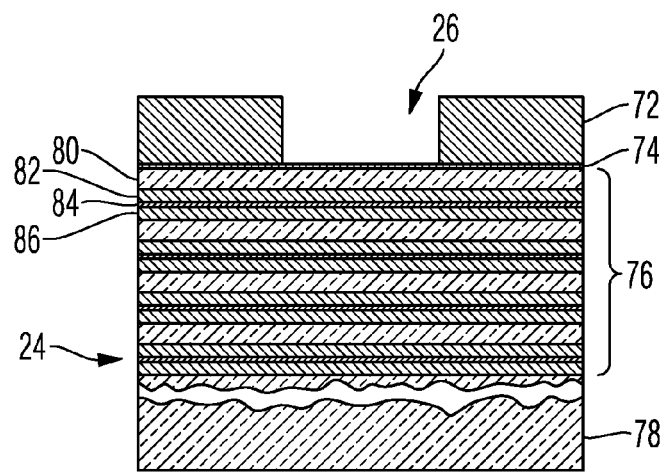
FIG. 6 shows a sectional view of a reflective test mask for use in the inspection apparatus in accordance with FIG. 3 in an embodiment according to the invention.

FIG. 6 shows a cross section through an embodiment of a test mask 24 operated in reflection, as shown in FIG. 3 or FIG. 4. The test mask 12 in accordance with FIG. 6 comprises a carrier layer 78, and a multilayer arrangement 76 is arranged on said carrier layer. Situated on the multilayer arrangement 76 are a protective layer 74 and an absorption layer 72, which has the test structure 26 in the form of a pinhole. The multilayer arrangement 76 comprises a multiplicity of sequences of the following layers (from top to bottom): a first multilayer layer 80 composed of Si, a second multilayer layer 82 composed of $MoSi_2$, a third multilayer layer 84 composed of Mo, and a fourth multilayer layer 86 composed of $MoSi_2$.

Exact specifications for designing the individual layers of the test mask 12 in accordance with FIG. 6 are contained for a first embodiment in Table 1 below. In this embodiment, the multilayer arrangement 76 comprises forty successive sequences of the layers Si—$MoSi_2$—Mo—$MoSi_2$. The indication concerning the test structure 26 is by way of example and can be modified in accordance with the variations explained in this application.

TABLE 1

| Diameter of the test structure 26 | |
|---|---|
| 125 nm | |
| Absorption layer 72 | |
| $Ta_6N_4$ | Thickness = 70 nm |
| Protective layer 74 | |
| Ru | Thickness = 2.5 nm |
| Multilayer arrangement 76: 40 × MoSi | |
| Si | Thickness = 2.798 nm |
| $MoSi_2$ | Thickness = 1.448 nm |
| Mo | Thickness = 0.992 nm |
| $MoSi_2$ | Thickness = 1.786 nm |
| Substrate | |
| Si | |
| Complex refractive indices at λ = 13.5 nm | |
| $Ta_6N_4$ | 0.93025 + i · 0.04338 |
| Ru | 0.88636 + i · 0.01706 |
| Si | 0.99932 + i · 0.00183 |

TABLE 1-continued

| | |
|---|---|
| MoSi$_2$ | 0.96933 + i · 0.00433 |
| Mo | 0.92108 + i · 0.00644 |

Source: http://henke.lbl.gov/optical constants

In a further embodiment of the test mask 12, the number of successive sequences of the layers Si—MoSi$_2$—Mo—MoSi$_2$ is less than forty, in particular twenty or thirty. For the rest, this embodiment corresponds to the specifications from Table 1. In this case, although the total reflectivity is lower than in the case of the embodiment having forty sequences, the reflectivity variation of an angular range of 1° to 13° is smaller.

A further embodiment of the test mask 12 differs from the embodiment in accordance with Table 1 in that nickel is used as material of the absorption layer 72, to be precise with the thickness of 49 nm. The complex refractive index of nickel at λ=13.5 nm is 0.94822–i·0.07272.

A further embodiment of the test mask 12 is specified in Table 2. In this embodiment, by comparison with the embodiment in accordance with Table 1, a protective layer 74 and MoSi$_2$ layers in the multilayer arrangement 76 are dispensed with. The multilayer arrangement 76 is thus formed only by forty sequences Si—Mo. The multilayer layers composed of Mo and Si and the absorption layer 72 furthermore have different layer thicknesses from those indicated in Table 1. In this embodiment, the test mask 12 is designed for a larger range of angles of incidence, to be precise an angular range of between approximately 0° and 17°.

TABLE 2

| Absorption layer 72 | |
|---|---|
| Ta$_6$N$_4$ | Thickness = 69.5 nm |
| Multilayer arrangement 76: 40 × MoSi | |
| Si | Thickness = 4.27 nm |
| Mo | Thickness = 2.86 nm |
| Substrate | |
| Si | |
| Complex refractive indices at λ = 13.5 nm | |
| Ta$_6$N$_4$ | 0.93025 + i · 0.04338 |
| Si | 0.99932 + i · 0.00183 |
| Mo | 0.92108 + i · 0.00644 |

In one variant of the embodiment in accordance with Table 2, the Mo layer in the multilayer arrangement 76 is replaced by a layer composed of ruthenium having a thickness of 2.70 nm. The thickness of the absorption layer 72 composed of Ta$_6$N$_4$ is increased to 70.5 nm. In this variant, the test mask 12 is designed for high reflectivity with a reflectivity value of up to 70% and great homogeneity in the reflectivity over an angular range of 0° to 10°.

The design of the multilayer arrangement 76 and the thickness of the absorption layer 72 is firstly optimized with regard to the angular spectrum offered by the illumination, and secondly chosen such that the phase retrieval measuring technique is stable in relation to fault influences, such as manufacturing faults, noise, dynamic range, etc. The following criteria were taken into account in choosing the diameter of the test structure 26 in the form of a pinhole: the smaller the pinhole, the more accurate the results of the phase retrieval algorithm under ideal conditions. However, a small pinhole is associated with larger faults on account of the three-dimensionality of the mask owing to the poorer aspect ratio. Furthermore, a higher useable light power and, as a result, better contrast ratios and higher stability in relation to fault influences are obtained in the case of a larger pinhole.

Phase retrieval methods according to the prior art use only two-dimensionally defined masks in the evaluation model. In accordance with the above-explained embodiment according to the invention in accordance with FIG. 6, the test mask 12 has a specific design of its three-dimensional structure which specifically takes account of the effects—which are not negligible in the EUV—of the wavefront source on the measurement accuracy of the phase retrieval measuring technique at EUV wavelengths.

The reflective EUV test mask 12 in accordance with FIG. 6 is realized by a reflective multilayer layer and an absorbent capping layer. The mask is structured by the design of the absorption layer, by virtue of the absorber being cut out in the bright regions of the mask. In the case of such an EUV mask, the following new effects in comparison with traditional transmission masks occur.

A first of these new effects concerns the reflectivity of the multilayer. The reflectivity of a multilayer is based on the interference of all partial rays reflected at the individual layers. Therefore, the reflectivity is greatly dependent on all variables that influence the optical path of the rays, such as the wavelength, the layer thicknesses and the layer materials. Moreover, the reflectivity is significantly dependent on the angle of incidence. The design of the multilayer is adapted to the wavelength and the angular spectrum offered by the illumination system. Moreover, a power loss at the multilayer should always be expected.

Another of these new effects concerns the residual reflectivity of the absorber in the form of the absorption layer 72. As a result of the residual reflectivity of the absorber material, even with an infinitely thick absorption layer complete darkening cannot be achieved and an intensity background remains which leads to a reduced contrast of the imaging of the structures. By choosing the absorber thickness in a suitable manner, it is possible to reduce the reflectivity by making use of interference effects of the rays which are reflected at the absorber terminating surface and the boundary layer between absorption layer and multilayer. Here, too, the residual reflectivity is dependent on the angle of incidence.

Another of these new effects concerns oblique chief ray angle. The fact that a mask is operated in reflection precludes a perpendicular useable illumination angle. As a result of the three-dimensionality of the mask, this induces differences in the imaging of horizontal and vertical extents of structures.

Another of these new effects concerns depth effects of the multilayer and of the absorber. In the multilayer there is no plane which can be regarded as a unique reflection plane. At each individual layer, part of the incident wave is reflected and produces a separate contribution to the definition of the object to be imaged. The thickness of the absorption layer not only defines the absorption coefficient thereof, but also produces shading effects at the edges, which increase in the case of a larger thickness and higher angles of incidence.

All these effects are not taken into account in the conventional phase retrieval evaluation algorithm and corrupt the result. In order nevertheless to achieve the required measurement accuracy, in accordance with an embodiment according to the invention, adaptations are made both to the measurement set-up and to the evaluation, as described below.

In accordance with one embodiment, the design of the test mask 12 is chosen such that the effects are as small as possible or can be compensated for. In particular, the properties of the illumination system are investigated in the case of object space defocusing. In the case of a pinhole as test structure, in accordance with one variation according to the invention, the pinhole diameter is chosen to be larger, relative to the Airy diameter, than is recommended for traditional phase retrieval in the case of visible light. In the case of traditional phase retrieval, the pinhole diameter is chosen to be less than 0.4 Airy diameter. As a result of the pinhole diameter being chosen to be greater than 0.4 Airy diameter, in particular greater than 0.5 Airy diameter, in accordance with the variation according to the invention, the absorber edge region that leads to shading effects thereby becomes smaller relative to the total area of the pinhole. Moreover, the useable radiation power, which is typically barely sufficient in EUV systems, is increased. The fault influences on account of the model fault in the case of larger pinholes and by account of the greater influences of the volume effects of the mask in the case of smaller pinholes are weighed up in order to find the optimum structure size for the respective system.

The phase retrieval algorithm makes it possible not only to determine the phase aberrations of the wavefront using an optimization iteration, but also to adapt other variables influencing the image stack of the test structure 26. In accordance with one embodiment, the apodization is adapted by a description with Zernike functions. As a result of the angle dependence of the multilayer reflectivity, the test structure produces an intensity profile over the angle space of the reflected light. In the case of a pinhole as test structure, an optimization of the apodization can at least partly compensate for this effect. However, this obstructs the possibility of measuring the real apodization ascribed to the lens, because the influences cannot be separated.

The shading effects at the absorber edges alter the effective shape and size of the test structure. Therefore, the aerial image cannot be described optimally if the test structure dimensions are assumed as the geometrical dimensions on the mask. Furthermore, the coherence setting a of the illumination alters the caustic curve of the imaging. With the use of a pinhole, in accordance with one embodiment, the pinhole diameter is freed as optimization parameter. Thus, this effect can be compensated for, but the diameter found in the optimization algorithm generally does not correspond to the real diameter.

Figure 7:
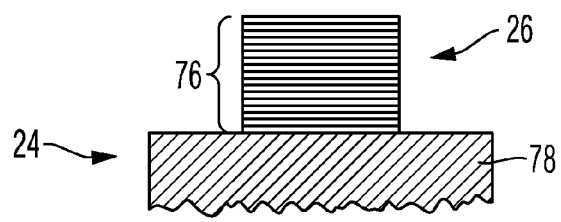
FIG. 7 shows a sectional view of a reflective test mask for use in the inspection apparatus in accordance with FIG. 3 in a further embodiment according to the invention.

FIG. 7 shows a cross section through a further embodiment of a test mask 24, which is operated in reflection like the embodiment in accordance with FIG. 6. In this embodiment, the test structure 26 is formed by a multilayer arrangement 76, also designated hereinafter as multilayer. The multilayer arrangement 76 is arranged on a carrier 78, for example composed of silicon, in the form of a so-called pillar structure. In accordance with one embodiment, the construction of the multilayer arrangement 76 in accordance with FIG. 7 corresponds to the above-described construction of the multilayer arrangement 76 in accordance with FIG. 6.

The bright regions of the test mask 24 in accordance with FIG. 7 are defined by the reflective multilayer arrangement 26. The dark regions are defined by the absence of the multilayer arrangement 26. A material having low reflectivity is used as carrier material on which the multilayer arrangement 26 is applied. At a wavelength of 13.5 nm, it is possible to use silicon having a refractive index of close to one. A high contrast can be produced with the pillar structure, since, in contrast to a solution with absorber masks, the reflective surfaces are not shaded by the absorber edges and the reflectivity of the silicon carrier is less than the reflectivity of customary absorber materials, such as e.g. tantalum nitride, tantalum boronitride, nickel or chromium.

Figure 8:
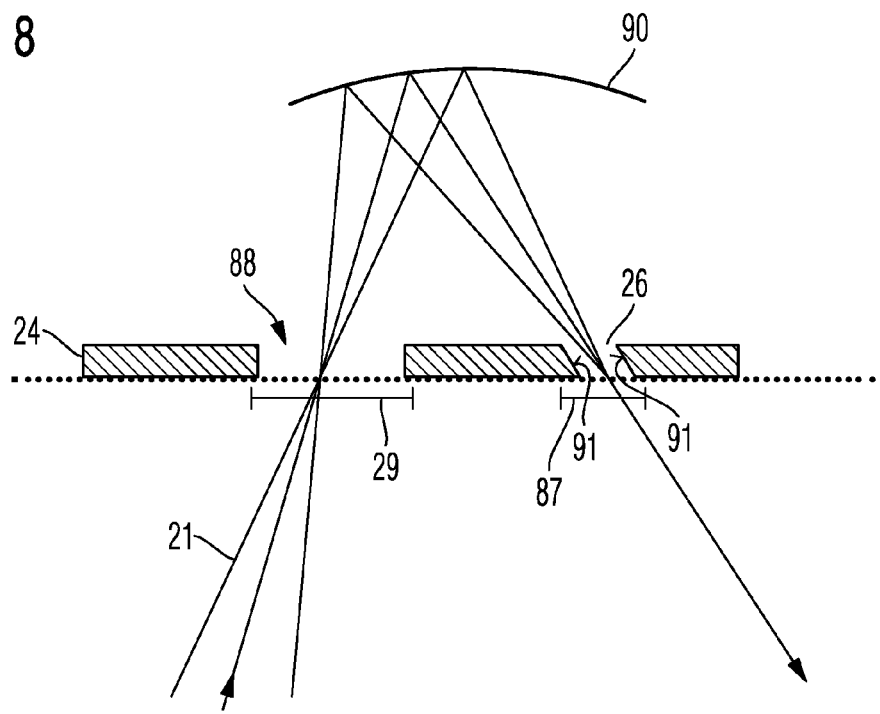
FIG. 8 shows an embodiment according to the invention of an arrangement of a test mask operated in transmission with an assigned deflection optical unit.

FIG. 8 shows an embodiment according to the invention of a test mask 24 which is used in conjunction with a reflective element in the form of a focusing mirror 90. The focusing mirror 90 constitutes a deflection optical unit which, preferably with a corresponding distance, is fixed to the test mask and thus integrated into the latter. The test mask 24 has an illumination cutout 88 besides the test structure 26, which is embodied as a cutout in the form of a pinhole. The illumination cutout 88 is arranged in the region of an illumination field 89 illuminated with the measurement radiation 21 by the illumination optical unit 20 of the measurement light radiating device 16, such that the measurement radiation passes through the illumination cutout 88. At the rear side of the test mask 24, that is to say the opposite side of the test mask 24 relative to the measurement light radiating device 16, the focusing mirror is arranged in such a way that the measurement radiation 21 is directed through the cutout of the test structure 26 after passing through the illumination cutout 88. The wall surfaces 91 of the cutout of the test structure 26 are beveled in such a way that they are oriented parallel to the chief ray of the measurement radiation 21 passing through the cutout. The test structure 26 is arranged in the region of the lens field 87 of the downstream lens 30, such that the measurement radiation 21 passes through the lens 30 after passing through the cutout of the test structure 26.

In other words, as a result of the illumination system being tilted, the illumination field 89 is displaced in such a way that the region around the test structure 26 is not illuminated from the actual illumination or lens side and is incident on the laterally offset through-opening in the form of the illumination cutout 88 in the test mask 24. The displaced illumination field 89 is imaged, by the deflection optical unit in the form of the focusing mirror 90, said deflection optical unit being integrated into the mask in accordance with one embodiment, back onto the rear side of the test mask 24 at the location of the test structure 26. In order to reduce shading effects as a result of the absorber walls, which also occur in the case of transmission masks, firstly the chief ray angle of the illumination is aligned with the chief ray angle of the lens. Secondly, the absorber walls are likewise designed to be parallel to the chief rays.

The embodiment in accordance with FIG. 8 is one form of realization of a mask concept according to the invention. Further forms of realization are shown in FIGS. 9 to 13. What is common to the different implementations is a use in transmission in the case of an illumination system which is designed for the use of a mask in reflection. The design of the three-dimensional structure of the masks specifically takes account of effects of the wavefront source, and thus of the mask and of the illumination on the measurement accuracy of the phase retrieval measuring technique at EUV wavelengths.

Providing a deflection optical unit according to the invention makes it possible to operate the test mask 24 effectively in transmission. If the mask influences of a conventional mask operated in reflection on the recording of the image stack are so great that they cannot be compensated for in the algorithmic evaluation and if there is a desire nevertheless to use a measurement system with an illumination that is typical of EUV systems for reflection masks, wherein illumination and lens are arranged on the same side of the mask, the integration of the deflection optical unit according to the invention enables the illumination to be deflected in such a way that operation in transmission is made possible.

FIGS. 9 to 13 illustrate further embodiments of a test mask 24 with a deflection optical unit. In the embodiment in accordance with FIG. 9, the deflection optical unit comprises, besides the focusing mirror 90 already known from FIG. 8, two further reflective elements 92 and 94, which are each formed from a multilayer and have a respective reflective plane surface. These are arranged in such a way that the measurement light 21, after passing through the illumination cutout 88, is additionally deflected at the two reflective elements 92 and 94 before it passes through the cutout of the test structure 26. In this case, the reflective element 92 and the focusing mirror 90 are spaced apart from the rear side of the test mask 24 and the reflective element 94 is arranged directly on the rear side of the test mask, such that the measurement light 21, after passing through the illumination cutout 88, is reflected successively at the elements 92 and 94 and thereupon at the mirror 90. In this arrangement, the illumination field 89 is imaged onto the lens field 91 in a reducing fashion.

Figure 9:
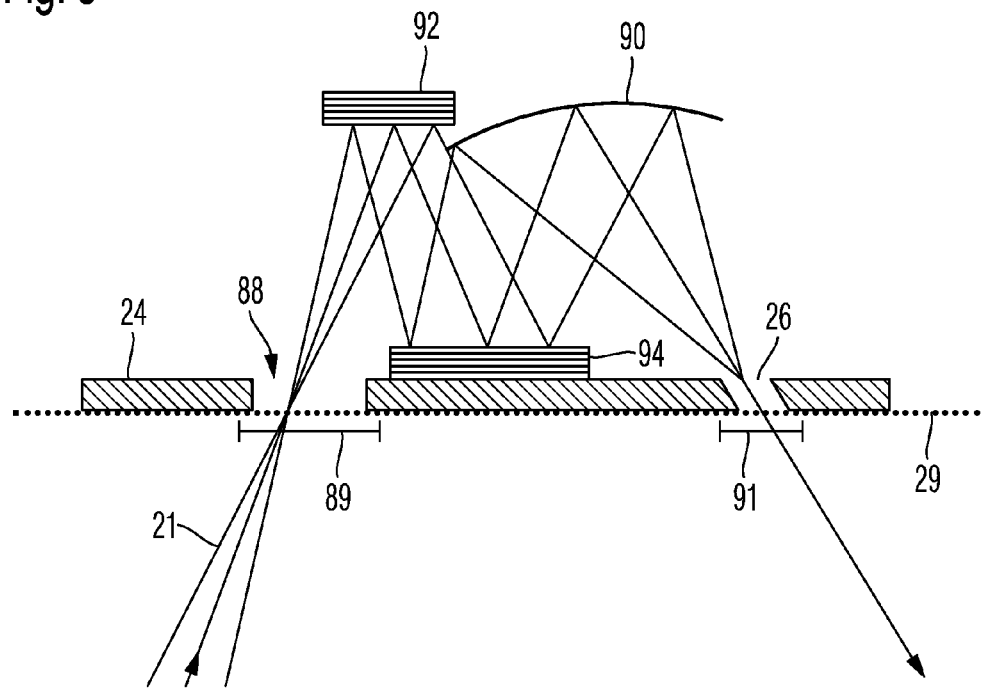
FIG. 9 shows a further embodiment according to the invention of an arrangement of a test mask operated in transmission with an assigned deflection optical unit.
Figure 10:
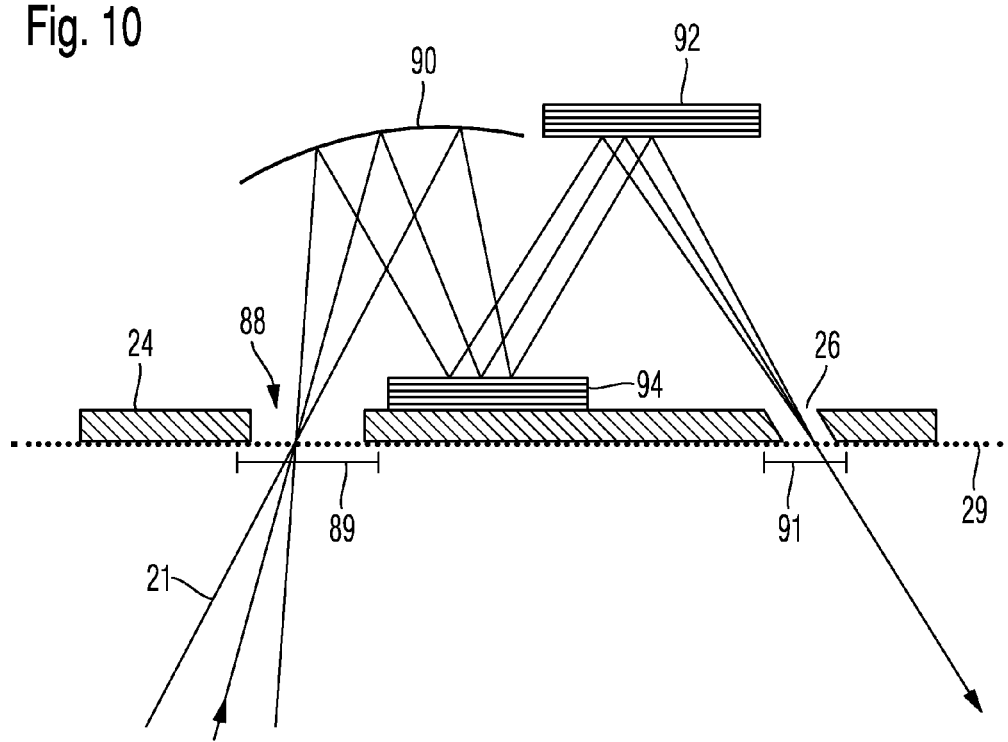
FIG. 10 shows a further embodiment according to the invention of an arrangement of a test mask operated in transmission with an assigned deflection optical unit.

The embodiment shown in FIG. 10 differs from the embodiment in accordance with FIG. 9 merely in the order of the arrangement of the elements 92 and 94 and of the focusing mirror 90. Here the arrangement is such that the measurement light 21 impinges firstly on the mirror 90 and thereupon on the elements 94 and 92. In this arrangement, the illumination field 89 is imaged onto the lens field 91 in a magnifying fashion.

With the embodiments in accordance with FIGS. 9 and 10, the conception in FIG. 8 with a deflection optical unit integrated into the test mask 24 is modified such that the illumination NA can be varied. This makes it possible to manipulate the coherence properties of the illumination. A reducing imaging of the illumination field 89 onto the lens field 91 enlarges the illumination NA and increases the degree of coherence. A magnifying imaging reduces the illumination NA and leads to a less coherent illumination. In the embodiments in accordance with FIG. 9 and FIG. 10, the optical path is folded by the reflective elements 92 and 94 in order to adapt the object and image distance to the desired magnification or reduction.

Figure 11:
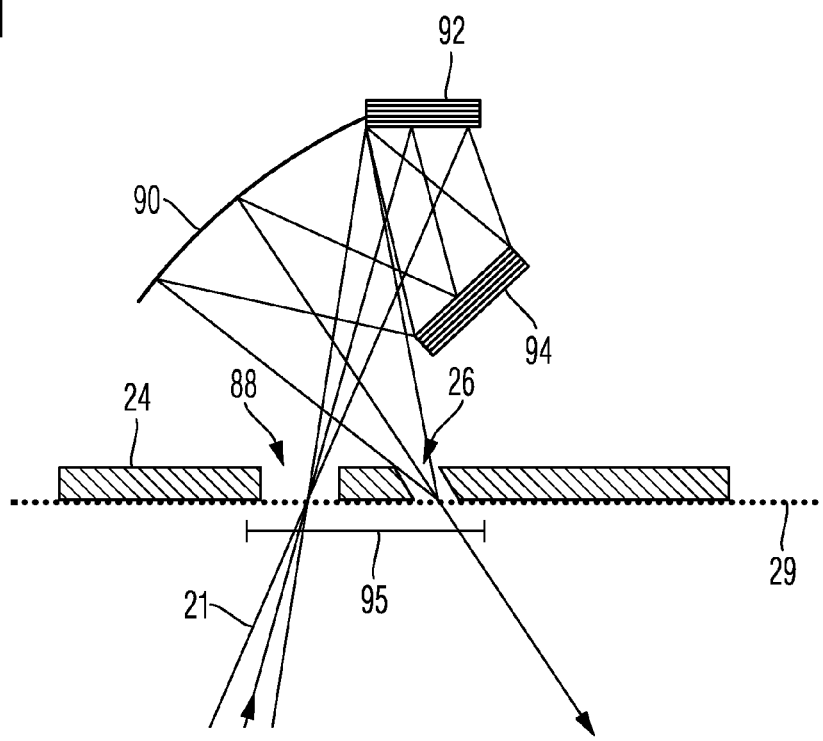
FIG. 11 shows a further embodiment according to the invention of an arrangement of a test mask operated in transmission with an assigned deflection optical unit.
Figure 12:
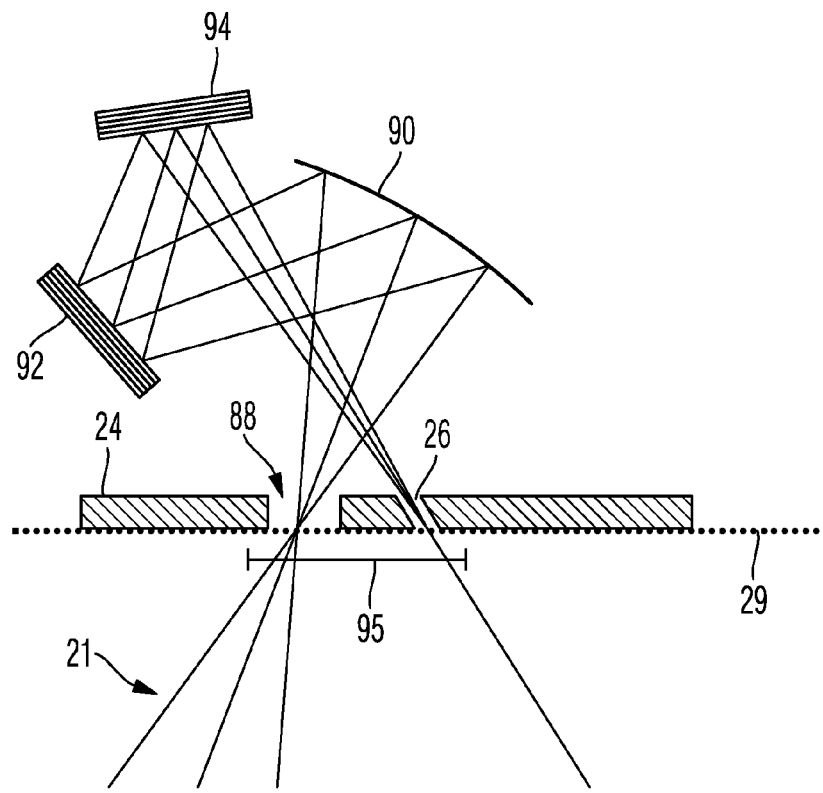
FIG. 12 shows a further embodiment according to the invention of an arrangement of a test mask operated in transmission with an assigned deflection optical unit.

The embodiments illustrated in FIGS. 11 and 12 differ from the embodiments in accordance with FIGS. 9 and 10 in the arrangement of the optical elements 92 and 94 and of the focusing mirror 90. These are arranged here such that the beam path of the measurement light 21 between passing through the illumination cutout 88 and passing through the cutout of the test structure 26 intersects twice. This is realized in such a way that the illumination cutout 88 and the cutout of the test structure 26 can be arranged in close succession in such a way that the lens field and the illumination field can be superimposed, thus resulting in a common illumination and lens field 95. The illumination cutout 88 and the cutout of the test structure 26 are thus both situated in the region of the illumination and lens field 95. It is thus possible to dispense with tilting the measurement light radiating device 16 between inspection operation and measurement operation.

The focusing mirror 90 is in each case embodied as an ellipsoid and, in the embodiment in accordance with FIG. 11, is arranged at the first location in the beam path of the measurement light 21, as a result of which the illumination field is imaged onto the lens field in a reducing fashion. In accordance with one embodiment variant, the focusing mirror 90 has in the center of its used region a radius of curvature of 3.8 mm in one direction and a radius of curvature of 4.8 mm in an orthogonal direction with respect thereto. The reflective plane surface of the element 92 has an inclination of 3.5° and the reflective plane surface of the element 94 has an inclination of 42°, in each case relative to the mask plane. This results in a reduction factor of approximately 0.4.

In accordance with one embodiment variant, the test mask 12 in accordance with FIGS. 11 and 12 is configured such that said test mask including the deflection optical unit does not exceed a total height of 6 mm. This design is adapted to a system having the following parameters: lens NA=0.2, illumination NA=0.12, distance between the test structure 26 and the illumination cutout 88 on the mask=50 µm.

Figure 13:
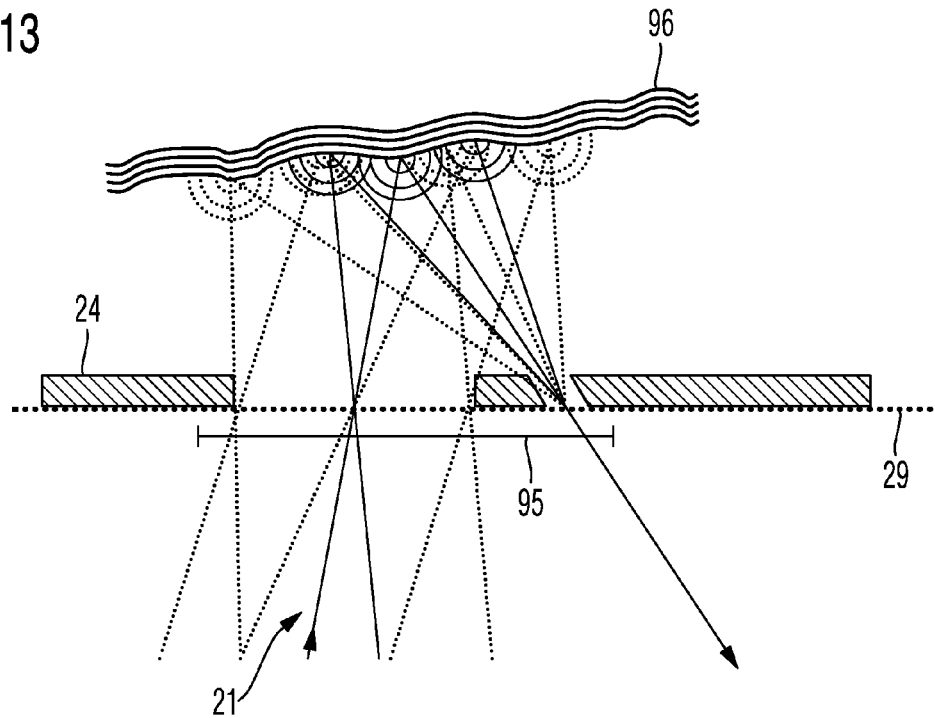
FIG. 13 shows an embodiment according to the invention of an arrangement of a test mask operated in transmission with an assigned deflection optical unit in the form of a diffusing plate.

FIG. 13 shows a further embodiment of a test mask 12 with a deflection optical unit. This differs from the embodiment in accordance with FIGS. 11 and 12 in that the deflection optical unit is formed by a diffusing plate 96. This likewise makes it possible to increase the angular range offered in the illumination. By varying the inclination angle of the diffusing plate 96, it is possible to optimize the diffusing angles in relation to the chief ray angle of the lens 30. In accordance with one embodiment variant, the arrangements shown in FIGS. 8 to 13 are integrated into a mask module having the dimensions of a product reticle configured for exposure in an EUV projection exposure apparatus for lithography.

FIGS. 14 to 18 illustrate different variants of the structural construction of the test mask 12 for use in the mask-deflection optical unit arrangements in FIGS. 8 to 13. These variants concern novel methods for reducing the reflectivity of the test masks 12 which help to improve the measurement accuracy when using the abovementioned special masks in transmission with a deflection optical unit, if that side of the test structures which faces the lens 30 lies in the illumination field.

If the lens-side surface of the test structure lies in the illumination field 89, then the residual reflectivity of the mask leads to an intensity background and poorer contrast in the images. It is therefore desirable for the measuring technique if the reflectivity of the mask is as low as possible. Measures that reduce the influences owing to the residual reflectivity are presented below.

The dark regions of the transmissive test mask 12 can be defined, in principle, by an absorption layer on a membrane, wherein the absorber is the lens-side terminating layer of the mask. A further layer between absorption layer and lens would cause disturbances of the imaging of the test structure. In order to reduce the reflectivity on the lens side, it may nevertheless be advantageous to apply an antireflection layer. The thickness of said layer is chosen such that, firstly, the intensities of the partial rays reflected at the boundary layers between vacuum and antireflection layer and between antireflection layer and absorption layer are of similar magnitude and their phase difference leads to destructive interference. The fault influences on the measuring technique owing to the imaging aberrations as a result of the antireflection layer and the fault influence on account of the reduction in contrast in the case of imaging without an antireflection layer are weighed up in order to find an ideal thickness and a suitable material of the antireflection layer.

Figure 14:
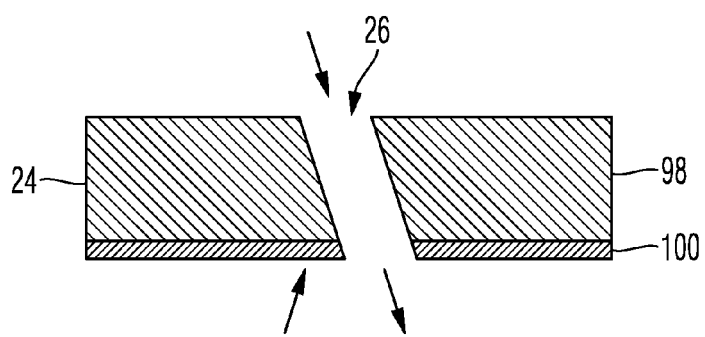
FIG. 14 shows a sectional view of a test mask operated in transmission for use in one of the arrangements in accordance with FIGS. 8 to 13.
Figure 15:
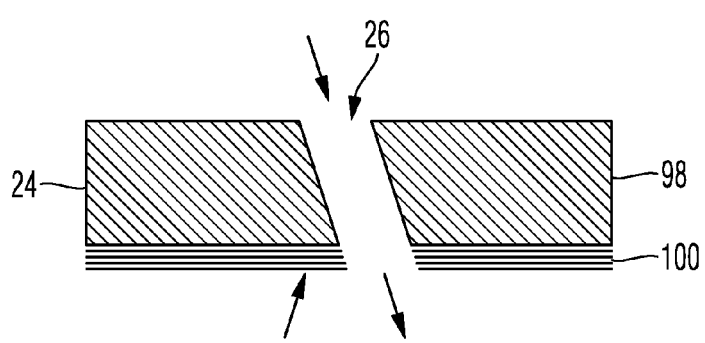
FIG. 15 shows a sectional view of a test mask operated in transmission for use in one of the arrangements in accordance with FIGS. 8 to 13.

In the embodiment in accordance with FIG. 14, the test mask 14 comprises an absorption layer 98 provided with an antireflection coating 100 on its side facing the measurement light radiating device 16. The material provided for the antireflection coating 100 is $SiO_2$ having a thickness of 10.5 nm for a chief ray angle of the measurement radiation 21 of 10°. The absorption layer 98 consists of 120 nm TaN. In the embodiment shown in FIG. 15, the antireflection coating 100 consists of a dielectric multilayer for reducing the reflectivity.

Figure 16:
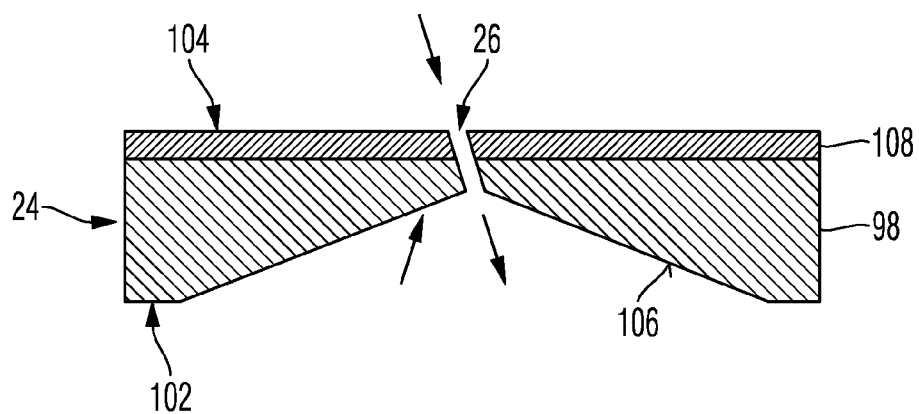
FIG. 16 shows a sectional view of a test mask operated in transmission for use in one of the arrangements in accordance with FIGS. 8 to 13.
Figure 17:
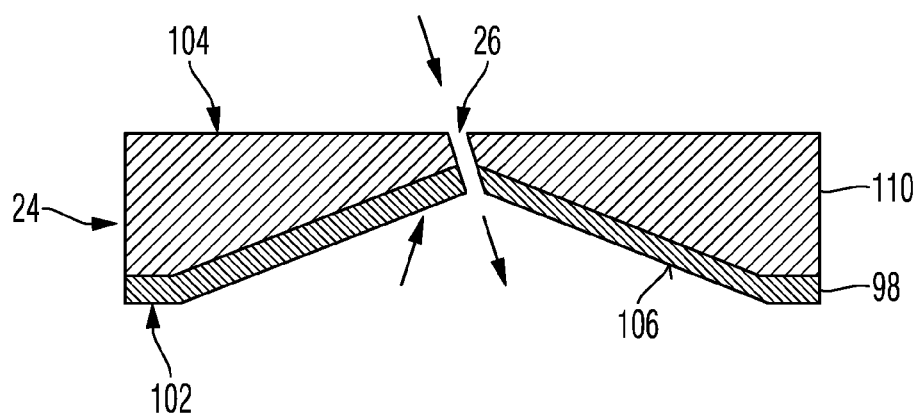
FIG. 17 shows a sectional view of a test mask operated in transmission for use in one of the arrangements in accordance with FIGS. 8 to 13.

FIGS. 16 and 17 show embodiments wherein the test mask 24 has, on its side 102 facing the measurement light radiating device 16 around the test structure 26, a surface region 106 which runs obliquely at least in sections with respect to the side 104 of the test mask 24 facing away from the measurement light radiating device 16. The profile of an inverted "V" arises in sectional illustration. In the embodiment in accordance with FIG. 16, the test mask 12 has an absorption layer 98 and a comparatively thin membrane 108 arranged above the absorption layer. The oblique course around the test structure 26 is brought about by a thickness variation of the absorption layer 98. In the embodiment in accordance with FIG. 17, the test mask comprises a comparatively thin absorption layer applied to a carrier layer 110 and the oblique course of the surface region around the test structure 26 is brought about by a thickness variation of the carrier layer 110.

As a result of the beveling of the absorption layer 98 in the region around the test structure 26, although the reflectivity of the absorption layer is not reduced, the reflected light can be directed past the lens 30 and does not contribute to an intensity background.

Figure 18:
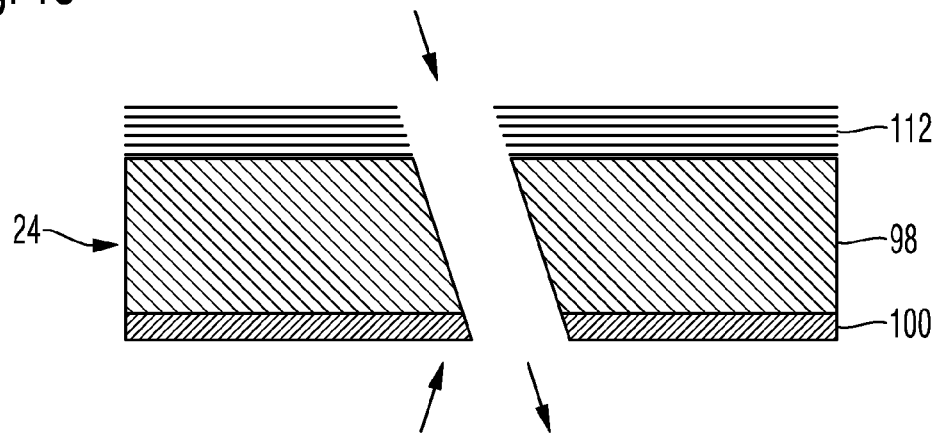
FIG. 18 shows a sectional view of a test mask operated in transmission for use in one of the arrangements in accordance with FIGS. 8 to 13.

FIG. 18 shows an embodiment of a test mask 24 operated in transmission, wherein the transmissivity of the dark regions is reduced. For this purpose, an absorption layer 98 of the test mask 24 is provided with an antireflection coating 100 on its side facing the measurement light radiating device 16 and with a reflective coating 112 on the opposite side. This construction is based on the following consideration: the residual transmissivity of the absorption layer of a transmission mask leads to a poorer contrast. The transmissivity can be reduced by two influencing variables, namely by an increase in the absorption and by an increase in the reflectivity on the side situated opposite the lens. The transmissivity can be reduced by a specularly reflective multilayer.

Various embodiments of the lens 30 are presented below. In this case, the lens 30 comprises an arrangement of at least two mirrors. In accordance with a first embodiment, the lens comprises a mirror-optical system having an operating wavelength of 6 nm-12 nm and an input-side numerical aperture (NA) of less than 0.05 and a magnification scale of at least 80. In accordance with a second embodiment, the lens comprises a mirror-optical system having an operating wavelength of 6 nm-12 nm, an input-side NA of 0.05-0.10 and a magnification scale of at least 150. In accordance with a third embodiment, the lens comprises a mirror-optical system having an operating wavelength of 6 nm-12 nm, an input-side NA of 0.10-0.20 and a magnification scale of at least 300. In accordance with a fourth embodiment, the lens comprises a mirror-optical system having an operating wavelength of 6 nm-12 nm, an input-side NA of greater than 0.20 and a magnification scale of at least 800. In accordance with a fifth embodiment, the lens comprises a mirror-optical system having an operating wavelength of 12 nm-15 nm, an input-side NA of less than 0.05 and a magnification scale of at least 60. In accordance with a sixth embodiment, the lens comprises a mirror-optical system having an operating wavelength of 12 nm-15 nm, an input-side NA of 0.05-0.10 and a magnification scale of at least 125. In accordance with a seventh embodiment, the lens comprises a mirror-optical system having an operating wavelength of 12 nm-15 nm, an input-side NA of 0.10-0.20 and a magnification scale of at least 250. In accordance with an eighth embodiment, the lens comprises a mirror-optical system having an operating wavelength of 12 nm-15 nm, an input-side NA of greater than 0.20 and a magnification scale of at least 650. In accordance with a ninth embodiment, the lens comprises a mirror-optical system having an operating wavelength of 15 nm-30 nm, an input-side NA of less than 0.05 and a magnification scale of at least 30. In accordance with a tenth embodiment, the lens comprises a mirror-optical system having an operating wavelength of 15 nm-30 nm, an input-side NA of 0.05-0.10 and a magnification scale of at least 60. In accordance with an eleventh embodiment, the lens comprises a mirror-optical system having an operating wavelength of 15 nm-30 nm, an input-side NA of 0.10-0.20 and a magnification scale of at least 125. In accordance with a twelfth embodiment, the lens comprises a mirror-optical system having an operating wavelength of 15 nm-30 nm, an input-side NA of greater than 0.20 and a magnification scale of at least 342.

FIG. 19 illustrates the principle of the phase retrieval evaluation method and has already been described above.

Two methods according to the invention are presented below, which methods, by virtue of their applicability, allow an extension and initiation of phase retrieval. The methods presented serve to extend the capture range of the phase retrieval measuring technique. In both approaches, a large capture structure 114 having an object-side diameter of a plurality of Airy diameters is defocused by changing the input or output vertex focal length and is recorded with the aid of the detector.

Figure 20:
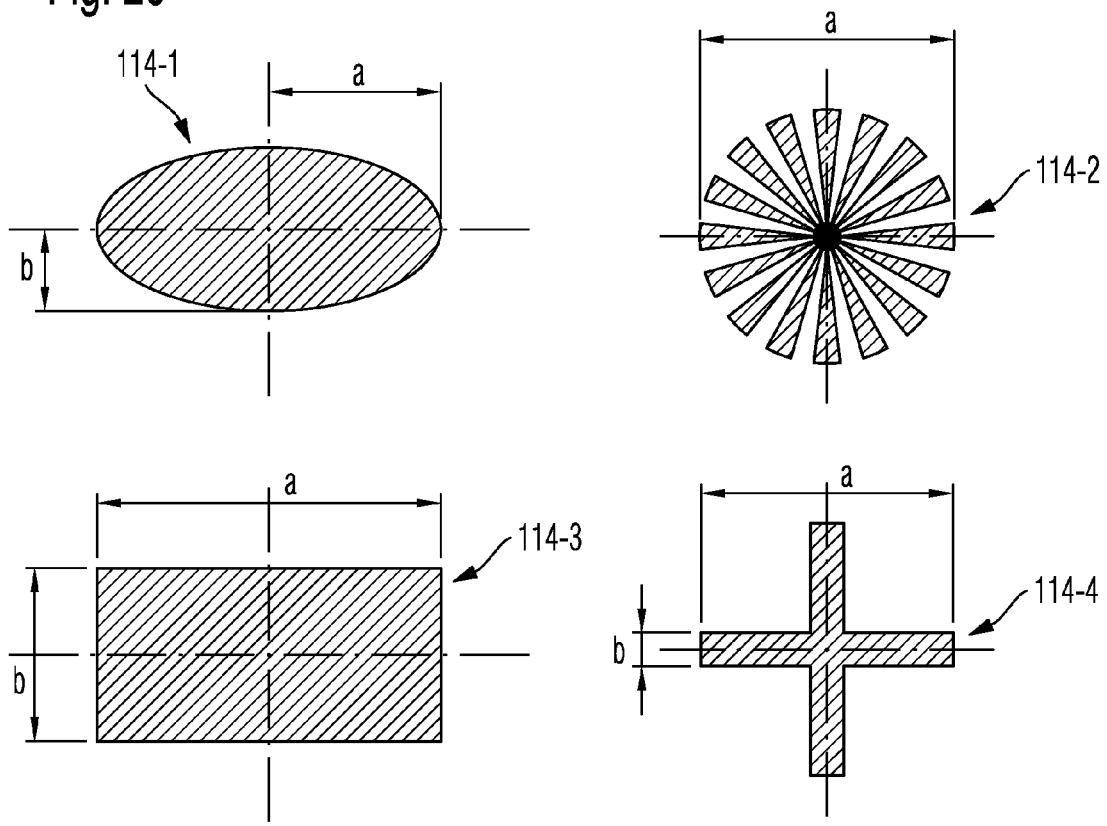
FIG. 20 shows an illustration of four different variants of capture structures for use in extending the capture range of the measuring system according to the first aspect of the invention.
Figure 21:
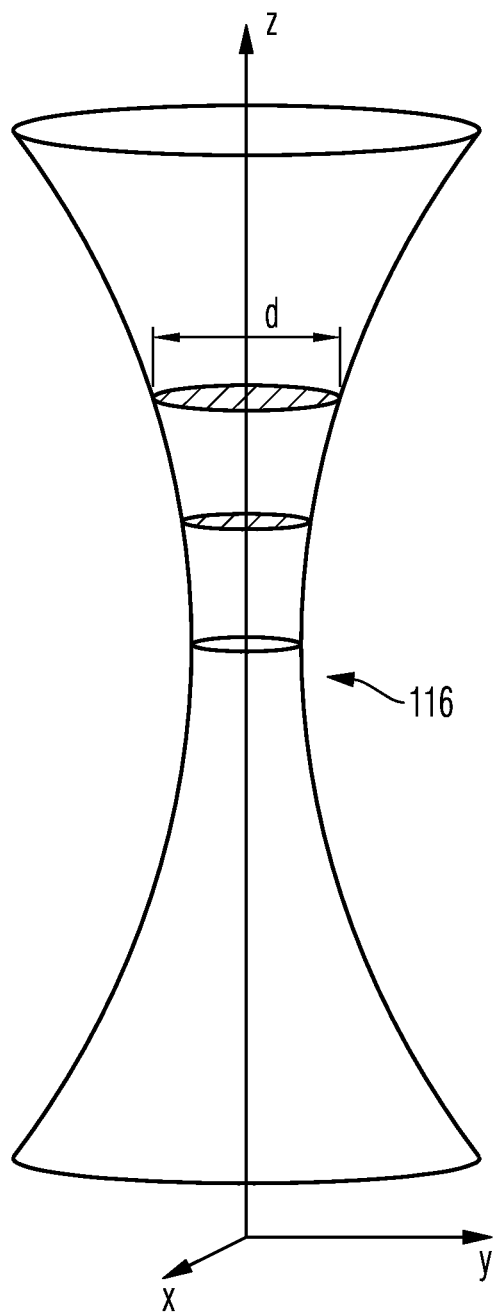
FIG. 21 shows an exemplary illustration of a caustic curve of an aerial image of the test structure used by the measuring system according to the first aspect of the invention.

Such capture structures 114 are illustrated by way of example in FIG. 20. A first capture structure 114-1 is an ellipse having semi-axes a and b of 1-10 Airy diameters. A second capture structure 114-2 is a rectangle having edge lengths a and b of 2-15 Airy diameters. A third capture structure 114-3 is a Siemens star having an extent a of 2-15 Airy diameters. A fourth capture structure 114-4 is a cross having a line width b of 0-2 Airy diameters and an extent a of 2-15 Airy diameters. The dimensions indicated in each case relate to object-side dimensionings.

The phase retrieval evaluation algorithm converges to the correct result only if the aberrations of the imaging optical unit to be measured are not too large. The capture range is dependent on the type of image aberrations. In the case of a pinhole as test structure and in the case of defocusing as image stack diversification in the range of −2 to +2 Rayleigh lengths, aberrations can no longer be determined correctly if the coefficients of the Zernike functions which describe the wavefront attain the order of magnitude of the wavelength or higher. In order to qualify even systems exhibiting high levels of aberrations, an extension according to the invention of the measuring technique is presented here.

A pinhole aerial image is recorded at different defocus positions produced by image space and/or object space defocusing. Only the caustic curve of the aerial image is examined in this case. Such a caustic curve 116 is illustrated by way of example in FIG. 21. Since only the caustic curve is examined and the diffraction fine structures are not relevant, the test structure can be chosen to be significantly larger than in the case of phase retrieval. This primarily has the advantage that, even in the case of highly defocused systems, a higher intensity is available for the test structure imaging.

In each defocus position, the centroid coordinates $(x_0, y_0)$ of the intensity centroid are determined. The "diameter" d of the caustic curve is defined by the radial second moment $\langle r^2 \rangle$. In this case:

$$r(z) = \sqrt{(x - x_0(z))^2 + (y - y_0(z))^2}$$

is the distance with respect to the intensity centroid in each z-plane.

$$<r^2>(z)=\iint dxdy I(x,y,z)r^2(z)$$

with the intensity distribution I(x,y,z). The minimum $z_0$ of $<r^2>(z)$ is assumed as the position of the focal planes. In order to obtain $z_0$, a regression parabola is plotted through the measurement points at the different defocus positions and the vertex thereof is determined.

From the position of the focal planes $z_0$, an estimate for the Zernike coefficient Z4 (defocus term) of the wavefront is obtained by $$Z4=1/2(1-\sqrt{1-NA^2})\cdot z_0$$

with the numerical aperture NA of the imaging system. It is analogously possible to determine the z-planes in which the waist width of the caustic curve in the x- or y-direction is the narrowest. These are the minima $z_x$ and $z_y$ of the second moments of x and y.

$$<x^2>(z)=\iint dxdy I(x,y,z)x^2(z)$$

$$<y^2>(z)=\iint dxdy I(x,y,z)y^2(z)$$

The 0° Zernike coefficient Z5 of the primary astigmatism is arrived at approximately by $$Z5=1/4(1-\sqrt{1-NA^2})\cdot(z_x\cdot z_y).$$

The 45°-Zernike coefficient Z6 is arrived at in the same way if the coordinate system used is rotated by 45° about the z-axis.

In accordance with the above-described embodiment of the evaluation method carried out by the evaluation device 15, the capture range of the measurement is extended by moment analysis of the caustic curve of an image of one of the capture structures 114-1 to 114-4.

In accordance with a further embodiment of the evaluation method carried out by the evaluation device 15, the capture range of the measurement is extended by determining the caustic curve of an image of one of the capture structures 114-1 to 114-4 by Radon transformation. In order to obtain the position of the best focus and an estimation of the proportions of the combined astigmatism and coma, an image stack of a large structure, as described above, is imaged onto the detector 14.

The evaluation is on the basis of the existing measuring technique. What is novel about this approach is extracting the caustic curve information from a structure by Radon transformation, in contrast to measuring a plurality of line structures and using said measuring technique as a direct extension for the phase retrieval measurement sequence.

Figure 22:
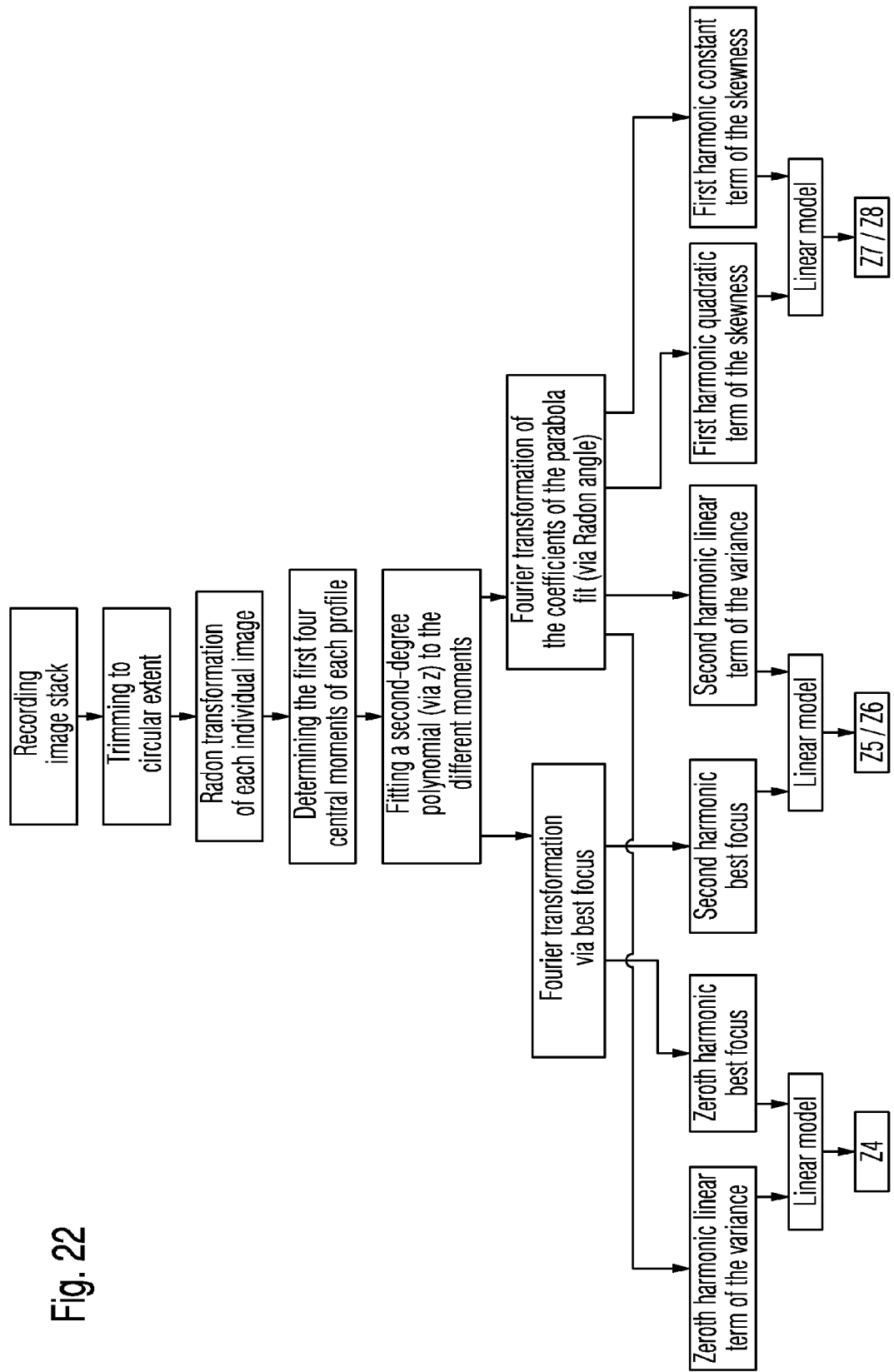
FIG. 22 shows a graph illustrating an embodiment according to the invention of a method for extending the capture range by Radon transformation.

The capture range extension according to the invention by Radon transformation is explained below with reference to FIG. 22. The following terms with the meanings presented below are used in this case:

individual image: the recording of the detector at one measurement position;

image stack: assignment of a plurality of individual images of the lens at different measurement positions (measurement position=z-position);

profile: summation of the intensities of an individual image along a direction alpha (y-value of the profile, with respect to the $1^{st}$ axis of an individual image) and assignment to a lateral position along the perpendicular to the direction alpha (x-value of the profile);

centroid of the profile: (S) value of the integral of the product of x and y divided by the integral over y; by convention, the centroid is also designated as the first central moment;

N-th central moment: integral of the product of the N-th power of the difference between x and the centroid and y divided by the integral over y;

variance: second central moment;

skewness: third central moment;

kurtosis: fourth central moment;

N-th harmonic: Fourier component (0-th harmonic=mean value);

best focus: extremum of a parabola fit to the variance along the z-axis.

The starting point for extending the capture range is that of recording an image stack with a distinctly larger step size than a comparable image stack for conventional phase retrieval. On account of the larger structures, the detector can also record a distinct signal in the far defocus positions.

The recorded image stack is preprocessed; in particular, each individual image is vignetted with a circular diaphragm in order to guarantee the same number of pixels in each image direction for the Radon transformation.

The preprocessed stack is projected onto individual profiles by Radon transformation along a number of angles (preferably a power of two, at least $2^3$). The first four moments, that is to say centroid, variance, skewness and kurtosis, are determined from these profiles.

An assignment of projection angles of the Radon transformation and z-position in the image stack to the respective moments of the profiles is thus obtained.

For each angle, the moments are fitted by a parabola with dependence in z. For each angle and each moment this results in a quadratic term, a linear term and a constant term of the fit, and also the extremum of the fitted parabola. The best focus is the extremum of the fit parabola of the variance.

Both the best focus and the coefficients of the parabola fits are Fourier-transformed along the angle of the Radon transformation. The different undulations after the Fourier transformation are a high compression of the original image information. A combined astigmatism, coma and defocus can be determined therefrom with sensitivities from a model.

The previous applications of the phase retrieval measuring technique serve for qualifying the imaging optical unit at an individual field point. Here an embodiment of a method according to the invention is presented with which a phase retrieval measurement is carried out simultaneously in parallel at a plurality of field points and with which additional information about the imaging system can be obtained.

Using a wavefront source which produces identical or different phase retrieval measurement structures simultaneously at a plurality of field points, a parallelization of the measuring technique can be achieved. In particular, this can be implemented when using an illumination system which illuminates the relevant field region, and a reflective or transmissive mask which defines the measurement structures at the field points to be measured.

In addition to the fact of being able to measure the imaging aberrations at different field points simultaneously and of thereby ensuring a faster measurement, this procedure allows access to relative differences at the individual measurement points. One example thereof is the relative lateral imaging position or the relative focus position of the measurement structures of the individual field points. In particular, a distortion measurement by parallel phase retrieval is possible as a result.

During a sequential measurement at the individual measurement points, uncontrollable changes in the measurement system from one measurement to the next, such as, for example, relative positioning accuracies of the wavefront source cannot be detected directly.

Figure 23:
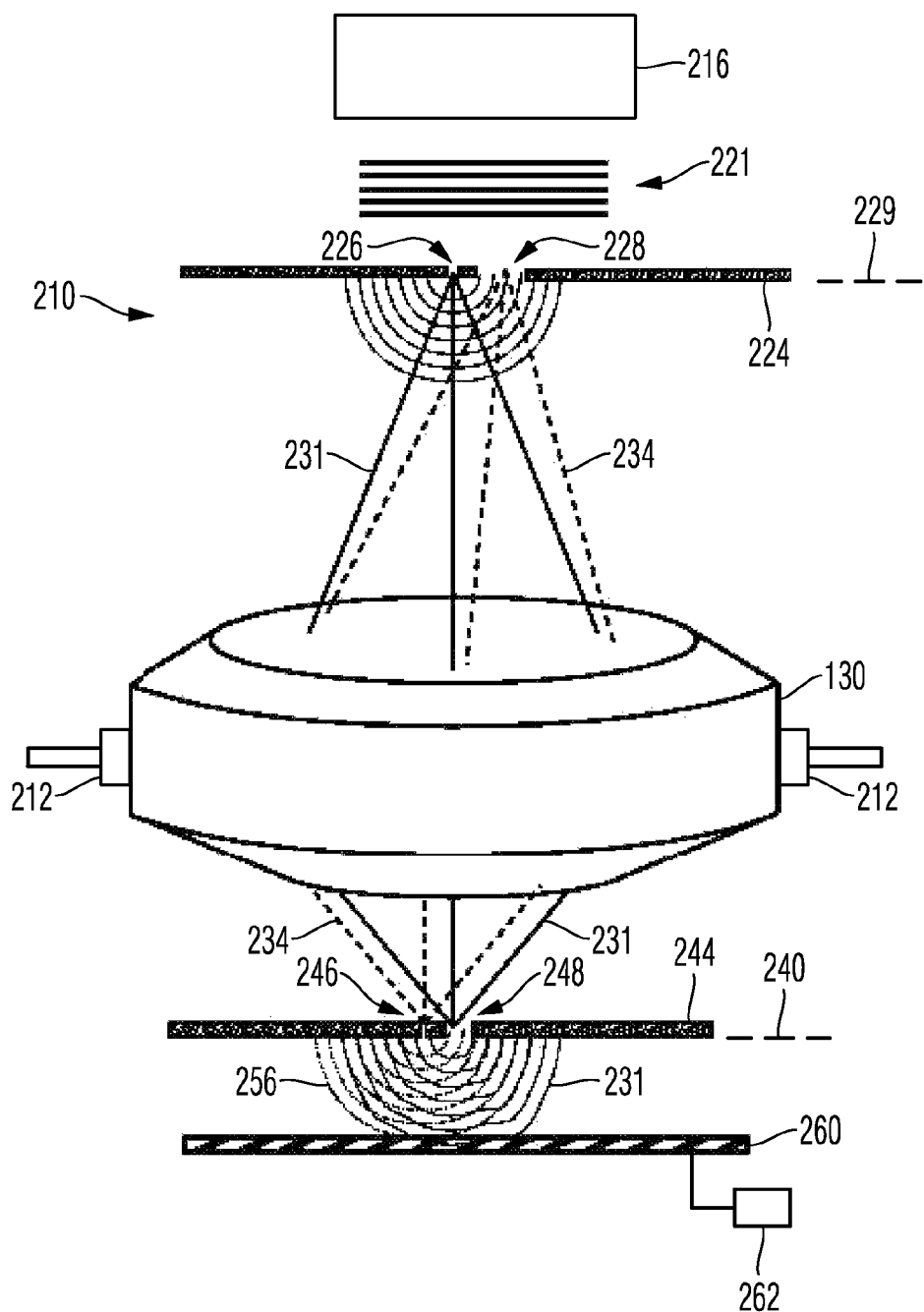
FIG. 23 shows an embodiment according to a second aspect of the invention of a measuring system for measuring an imaging quality of a lens comprising two diffractive test structures arranged on respective test masks operating in transmission.
Figure 24:
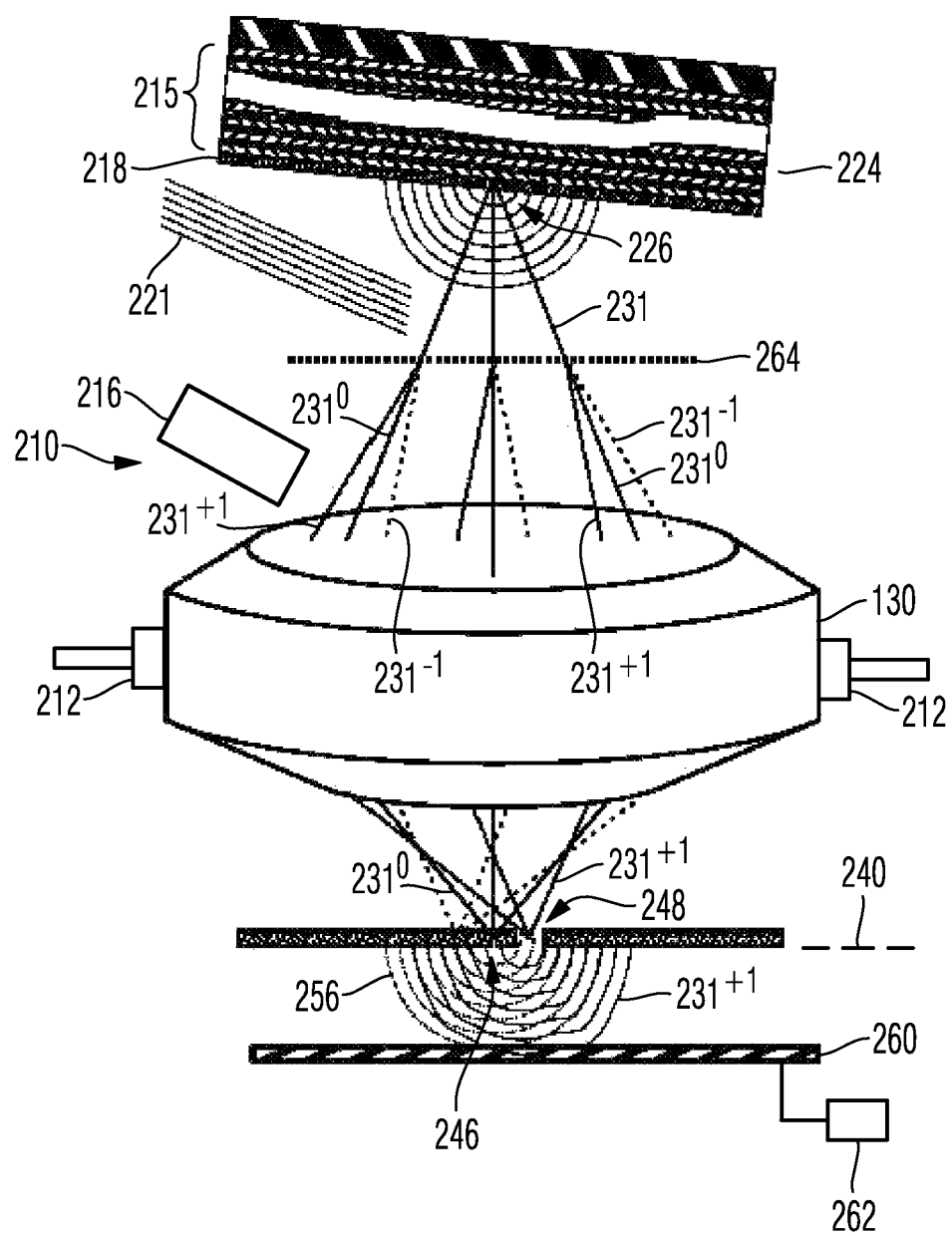
FIG. 24 shows a further embodiment according to a second aspect of the invention of a measuring system for measuring an imaging quality of a lens comprising two diffractive test structures, a first one arranged on a reflective test mask and a second one arranged on a test mask operating in transmission.
Figure 25:
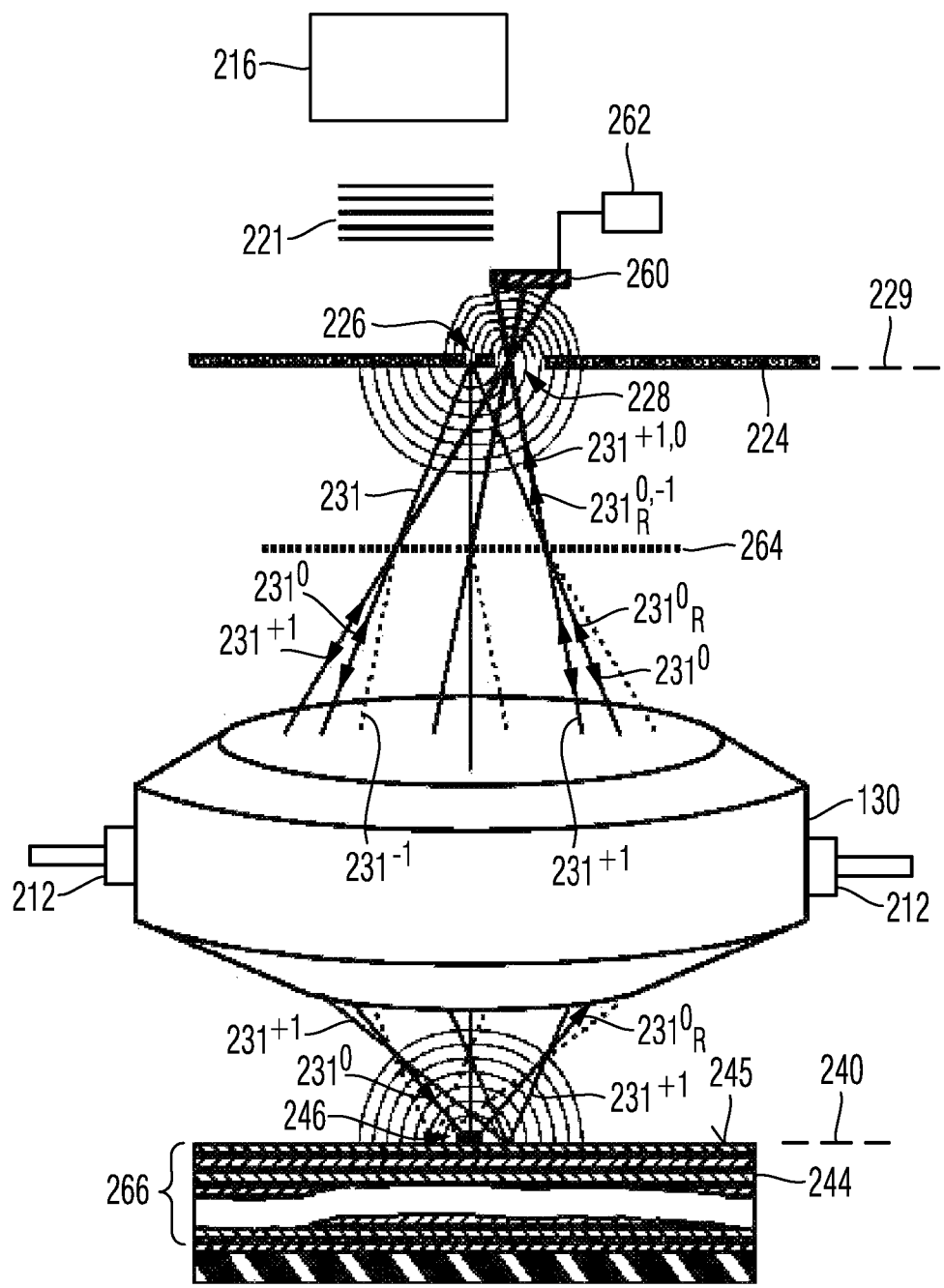
FIG. 25 shows an embodiment according to a second aspect of the invention of a measuring system for measuring an imaging quality of a lens comprising two diffractive test structures, a first one arranged on a test mask operating in transmission and a second one arranged on a reflective test mask.

FIGS. 23 to 25 illustrate a second aspect of the invention. FIG. 23 shows an embodiment of a measuring system according to a second aspect of the invention, which measuring system is designated by the reference numeral 210 and is configured for measuring an imaging quality of a lens 130. The lens 130 comprises several optical elements and can be an EUV lens 30 of the type described above e.g. with respect to FIG. 1. Further the lens 130 can be a lens adapted to a different wavelength, e.g. a wavelength in the UV-wavelength range, such as 248 nm or 193 nm.

The measuring system 210 comprises a measurement light radiation device 216 configured to produce measurement light 221 with a wavelength adapted to the operating wavelength of the lens 130, such as an EUV-wavelength. The measurement radiation device 216 can e.g. be configured identically to the measurement radiation device 16 shown in FIG. 1. The measurement system 210 further comprises a first test mask 224 arranged on an object side of the lens 130, a second test mask 244 arranged on an image side of the lens 130, a lens holder 212 for holding the lens 30, a detector 260 and an evaluation device 262. To be precise, the first test mask 224 is arranged in an object plane 229 of the lens 130 and the second test mask is arranged in an image plane 240 of the lens 130.

The measurement light 221 is irradiated onto the first test mask 224. The first test mask 224 comprises a first diffractive test structure 226 in form of a pinhole. The measurement light 221 is diffracted at the test structure 226 generating a test wave 231 propagating towards the lens 130. The test structure 226 may be configured identically to the test structure 26 according to FIG. 1. Especially the test structure 226 is configured such that the test wave 231 generated by diffraction is an expanding wave having a wavefront which has a maximum deviation of 0.1 nm or less from a target shape, e.g. from an ideal shape of a conic section, in particular from a sphere. In different words, the wavefront of the test wave 231 is very well defined. The test wave 231 is also referred to as "wavefront optimized" wave. In the embodiment shown in FIG. 23 the wavefront of the test wave 231 has a wavefront optimized spherical shape, in other words the test wave 231 has an "idealized" spherical wavefront.

The first test mask 224 further comprises a free aperture 228 being configured to let measurement light 221 pass through to form a reference beam 234, wherein the free aperture 228 is configured such that diffraction effects are not predominant when forming the reference beam 234, which is different from the formation of the test wave 231. For this purpose, the free aperture has a diameter larger than ten times of the Airy diameter of the measurement light 221. The Airy diameter $d_{Airy}$ is defined as follows:

$$d_{Airy} = 1.22 \cdot \frac{\lambda}{NA},$$

wherein $\lambda$ is the wavelength of the measurement light 221 and NA is the numerical aperture of the lens 130.

According to an embodiment, the free aperture 228 is at least ten times larger than the test structure 226. The free aperture 228 is arranged next to the test structure 226, such that the test wave 231 and the reference beam 234 both propagate towards the lens 130. The first test mask 224 shown in FIG. 23 is embodied as a transmission mask with the test structure 226 configured as a transmission pinhole and the free aperture 228 forming the reference beam in transmission. Alternatively, the first test mask 224 may also be configured as a reflective mask having the test structure 226 configured as a small reflective spot and the free aperture 228 being configured as a larger reflective area on the mask.

The test wave 231 traverses the lens 130 and then converges at a free aperture 248 contained in the second test mask 244. The free aperture 248 is configured analogously to the free aperture 228 in the first test mask 224 such that the test wave 231 passes through without a significant diffraction effect. Therefore, the wave front of the test wave 231, which started as a "wavefront optimized" spherical wave at the diffractive test structure 226 and accumulated wavefront deviations on its way through the lens 130 due to aberrations of the lens, passes through the free aperture 248 without a further modification of its wavefront.

The reference beam 234 also traverses the lens 130 and converges at a second diffractive test structure 246 in form of a pinhole arranged in the second test mask 244 next to the free aperture 248. The second diffractive test structure 246 is configured similar or identical to the first diffractive test structure 226 and results in the generation of a reference wave 256 in form of a "wavefront optimized" spherical wave.

The reference wave 256 having an idealized spherical wavefront and the test wave 231 containing the wavefront deviations obtained from traversing the lens are superimposed on the detector 260, which is arranged underneath the second test mask 244. The detector, being a two-dimensionally resolving detector, records an interference pattern generated by superimposition of the reference wave 256 and the test wave 231. By evaluation the recorded interference pattern in the evaluation device 262 at least one parameter characterizing the imaging quality of the lens 130 is determined, such as Zernike coefficients characterizing the wavefront aberrations of the lens 130.

FIG. 24 illustrates a further embodiment of a measuring system 210 according to the invention. The measuring system 210 according to FIG. 24 differs from the measuring system 210 according to FIG. 23 in the configuration of the first test mask 224 and in the further provision of a diffraction grating 264. The first test mask 224 in the embodiment according to FIG. 24 is configured as a reflective reticle comprising a reflective multi-layer stack 215 and an absorption layer 218 on its surface exposed to the measurement light 221. The absorption layer 218 contains a pinhole, which pinhole forms together with the reflective surface underneath the first diffractive test structure 226. By illuminating the diffractive test structure 226 with the measuring light 221, e.g. in form of a plane wave, the test wave 231 having a wavefront optimized spherical shape is generated. The above mentioned diffraction grating 264 is arranged between the first test mask 224 and the lens 130, such that the test wave 226 is split up into different beams of light having different propagation directions. A first beam $231^0$ is formed from the $0^{th}$ diffraction order of the test wave 231 generated at the diffractive test structure 226. A second beam $231^{+1}$ is formed from the $+1^{st}$ diffraction order and a third beam $231^{-1}$ is formed from the $-1^{st}$ diffraction order of the test wave 231.

The first beam $231^0$ traverses the lens 130 and converges on the second diffractive test structure 246 of the second test mask 244 in form of a pinhole, such that the reference wave 256 in form of a wavefront optimized spherical wave is generated. The second beam $231^{+1}$ also traverses the lens 130, converges on the free aperture 248 and traverses the free aperture 248 without modification of its wavefront. The interferogram formed from the reference wave 256 and the second beam $231^{+1}$ containing wavefront aberrations due to its interaction with the lens 130 are evaluated by the evaluation device 262, e.g. as described with respect to FIG. 23. Especially the evaluation may be performed using algorithms known from point diffraction interferometry. For the purpose of improving the measurement resolution the diffraction grating 264 may be shifted systematically in order to change the phase relationship of the $0^{th}$ harmonic and the $1^{st}$ harmonic. This phase information may be used in the algorithms to achieve a better noise reduction in the signal processing.

Further, the embodiment according to FIG. 24 may be modified by arranging the diffraction grating 264 between the lens 130 and the second test mask 244 instead of between the first test mask 224 and the lens 130.

FIG. 25 shows a further embodiment of a measuring system 210 according to the invention. The measuring system 210 according to FIG. 25 comprises the measurement light radiation source 216 and the first test mask 224 described with respect to the embodiment according to FIG. 23. Further, the diffraction grating 264 is arranged between the first test mask 224 and the lens 130. The second test mask 244 comprises a reflective multilayer stack 266 forming a reflective surface 245 facing towards the lens 130. The second test mask 244 further comprises a second test structure 246 in form of a diffraction limited absorbing structure which generates a "wavefront optimized" spherical wave according to Babinet's principle. The diffraction limited absorbing structure is dimensioned analogously to the second test structure 246 in form of a pinhole described e.g. with respect to the embodiment according to FIG. 23. In the embodiment of the measuring system 210 according to FIG. 25 the detector 260 is arranged behind the free aperture 228 of the first test mask 224, i.e. on the side of the first test mask 224 facing away from the lens 130.

The detector 260 is arranged such that the free aperture 228 is blocked from the measuring light 221 irradiated by the radiation device 216 onto the first test mask 224. Therefore, only the first test structure 226 in form of a pinhole is irradiated by the measuring light 221. The test wave 231 emanating from the test structure 226 is split up at the diffraction grating 264 into the three beams $231^0$, $231^{+1}$ and $231^{-1}$ already described with respect to the embodiment according to FIG. 24. The beam $231^0$ containing the $0^{th}$ diffraction order light is focused at the second test structure 246, resulting in the generation of a "wavefront optimized" spherical wave propagating back towards the lens 130 designated as reference wave $231_R^0$. The reference wave $231_R^0$ traverses the lens 130 and strikes the diffraction grating 264. At the diffraction grating 264 a $-1^{st}$ diffraction order of the reference wave $231_R^0$, designated reference light portion $231_R^{0,-1}$, is generated. The reference light portion $231_R^{0,-1}$ is focused onto the free aperture 228 in the first test mask 224. After traversing the free aperture 228 the reference light portion $231_R^{0,-1}$ strikes the detector 260.

The beam $231^{+1}$ generated at the diffraction grating 264 traverses the lens 130 and converges at an area of the second test mask 244 next to the diffractive test structure 246, which area is part of the reflective surface 245, forming a light reflecting background of the diffractive test structure 246, such that the beam $231^{+1}$ traverses the lens once again in opposite direction and strikes the diffraction grating 264. The $0^{th}$ diffraction order of the beam $231^{+1}$, designated test light portion $231^{+1,0}$ is focused onto the free aperture in the first test mask. After traversing the free aperture 228 the light portion $231^{+1,0}$ forms an interference pattern on the detector 260 by being superimposed with the reference light portion $231_R^{0,-1}$.

The interferogram is evaluated by the evaluation device 260 analogously to the evaluation described above with reference to FIGS. 23 and 24. The fact that the reference light portion $231_R^{0,-1}$ has traversed the lens 130 only once after the generation of the "wavefront optimized" reference wave $231_R^0$, while the light portion $231^{+1,0}$ has traversed the lens 130 twice after generation of the "wavefront optimized" test wave 231, allows the imaging quality of the lens 130 to be determined from the interference patter recorded by the detector 260. The measurement accuracy may be improved by evaluating the interference pattern generated at various shifted positions of the diffraction grating 246.

Figure 26:
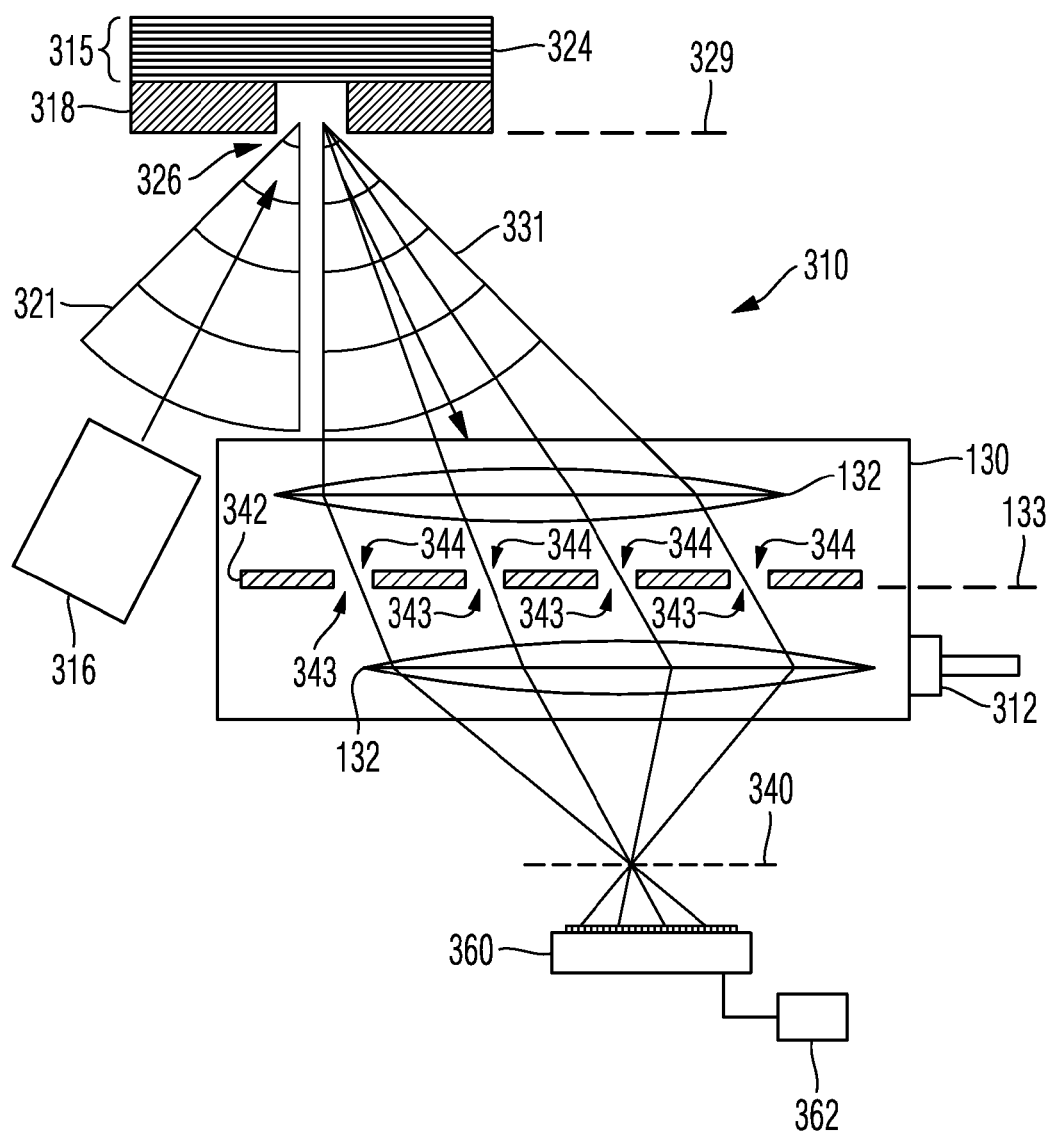
FIG. 26 shows an embodiment according to a third aspect of the invention of a measuring system for measuring an imaging quality of a lens comprising a light modulation device arranged in a pupil plane of the lens during measurement.

FIG. 26, illustrating a third aspect of the invention, shows a further embodiment of a measuring system according to a third aspect of the invention, which measuring system is designated by the reference numeral 310 and is configured for measuring an imaging quality of a lens 130. The lens 130 comprises several optical elements 132, which can be configured as lens elements or mirrors depending on the design of the lens 130. The lens 130 can be an EUV lens of the type described above e.g. with respect to FIG. 1 and designated "EUV lens 30". Further the lens 130 can be a lens adapted to a different wavelength, e.g. a wavelength in the UV-wavelength range, such as 248 nm or 193 nm. The lens 130 comprises a pupil plane 133. A pupil plane is characterized in that the local intensity distribution of the light in the pupil plane, which converges on a specific field point in an image plane 340 of the lens 130 corresponds to the angularly resolved intensity distribution at this field point.

The measuring system 310 comprises a measurement light radiation device 316 configured to produce measurement light 321 with a wavelength adapted to the operating wavelength of the lens 130, such as EUV. The measurement radiation device 316 can e.g. be configured identically to the measurement radiation device 16 shown in FIG. 1. The measurement system 310 further comprises a test mask 324 arranged on an object side of the lens 30, a lens holder 312 for holding the lens 130, a light modulation device 342 in form of a diaphragm, a detector 360 and an evaluation device 362. To be precise, the first mask 224 is arranged in an object plane 329 of the lens 130.

The measurement light 321 is irradiated onto the test mask 324. The test mask 324 comprises a diffractive test structure 326. In the embodiment shown in FIG. 26 the test mask 324 is configured as a reflective reticle comprising a reflective multi-layer stack 315 and an absorption layer 318 on its surface, which absorption layer 318 is exposed to the measurement light 321. The absorption layer 318 contains a pinhole to form together with the reflective surface underneath the diffractive test structure 326. By illuminating the diffractive test structure 326 with the measuring light 321 a test wave 331 having a wavefront optimized spherical shape is generated. According to an alternative embodiment the test mask 324 may be configured as a transmission mask with the test structure 325 being configured as a pinhole in form of a cutout.

The measurement light 321 is diffracted at the test structure 326 generating a test wave 331 propagating towards the lens 130. The test structure 326 may be configured identically to the first diffractive test structure 226 according to FIG. 24. Especially the test structure 326 is configured such that the test wave 331 generated by diffraction is an expanding wave having a wavefront which has a maximum deviation of 0.1 nm or less from a target shape, e.g. from an ideal shape of a conic section, in particular from a sphere. In different words, the wavefront of the test wave 331 is very well defined. The test wave 331 is also referred to as "wavefront optimized" wave. In the embodiment shown in FIG. 26 the wavefront of the test wave 331 has a wavefront optimized spherical shape, in other word is an "idealized" spherical wavefront.

The light modulation device 342 mentioned above, which is a diaphragm in the embodiment shown in FIG. 26, is arranged in the pupil plane 133 of the lens 130. The light modulation device 342 comprises several modulation structures 344 in form of transmissive regions, in particular cutouts, which modulation structures 344 are arranged in a two dimensional array of test locations 343 over the area of the pupil plane 133 illuminated by the test wave 331, i.e. over the pupil.

The detector 360, being a two-dimensionally resolving detector, is arranged in a position offset from the image plane 340 of the lens 130, the image plane 340 being the focal plane of the lens 130 into which the test structure 326 is imaged. In different words, the detector 340 is arranged in a defocused position. The focus offset is chosen such that light spots generated by the modulation structures 344 on the detector 340 are separated from each other spatially. The offset may e.g. be chosen to be larger than one Rayleigh length defined as the Quotient of the wavelength of the measuring light 321 over the square of the numerical aperture of the lens 130.

The intensity pattern generated on the detector 360 is recorded and compared with a predetermined target pattern by the evaluation device 362. The intensity pattern is made up from the light spots generated by the modulation structures 344. The target pattern defines the locations of the light spots relative to each other. When comparing the recorded intensity pattern with the target pattern, deviations of the locations of the light spots from respective target locations are determined. From these deviations the imaging quality of the lens 130, in particular wavefront aberrations of the lens 130 are determined. From a measured deviation of the location of a light spot from its target location a gradient of the wavefront of the test wave 331 in the pupil plane 133 can be determined. From gradients determined in this way the overall wavefront of the test wave 331 in the pupil plane 133 can be determined.

The use of the test wave 331 having an "idealized" spherical wavefront generated by the diffractive test structure 326 described above allows a very precise measurement of the wavefront aberrations of the lens 130 as measurement errors resulting from the wave front source can be minimized.

As an alternative to arranging the light modulation device 324 having several modulation structures arranged in a two dimensional array of test locations 342, several light modulation devices may be used, each having only one modulation structure at a different test location. In this case the light modulation devices, e.g. in form of diaphragms, each having a differently positioned cutout, are inserted into the pupil plane 133 one after the other and a respective location of the resulting light spot on the detector 360 is recorded for each light modulation device. In this case the detector 360 may be arranged in the image plane 360.

FIGS. 27 to 32 illustrate several arrangements of a correction plate 470 in different embodiments and a test mask 424 comprising a diffractive test structure 426. The illustrated arrangement of the correction plate 470 allow a further optimization of the wavefront of test wave 431 generated from diffraction of measurement light 421 at the diffractive test structure 426 and may be applied to any of the measuring systems 10, 210 or 310 illustrated above, i.e. the test mask 424 represents the test masks 24, 224 or 324 shown in FIGS. 1 to 26, as appropriate.

The further optimization of the wavefront of the test wave 431 is designed to correct for effects related to a lateral extension of the test mask 424 when generating the test wave 431 at the diffractive test structure 426. Lateral extension effects are becoming fairly significant in case of test masks 424, which are adapted to an EUV-wavelength and have a high contrast, as currently no materials are known, which have are highly absorptive or highly reflective at this wavelength. Therefore, the lateral extension of the test mask 424 may effect wavefront distortions of the test wave 431 with respect to the desired shape of the test wave 431, such as the spherical shape. The correction plate 470 illustrated in various embodiments below allows a correction of these wavefront distortions to obtain a wavefront which is adapted even better to the desired shape.

Figure 27:
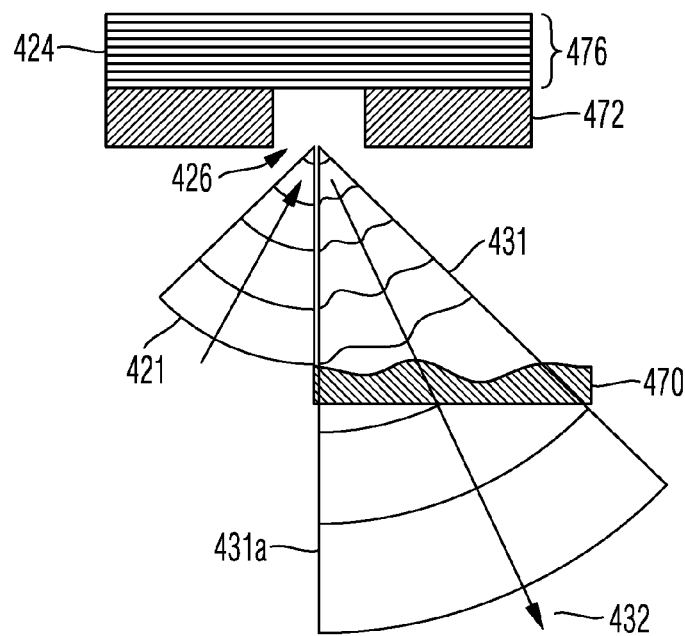
FIG. 27 shows a first embodiment of an arrangement of a test mask and a correction plate.

FIG. 27 illustrates an embodiment in which the test mask 424 is configured as a reflective mask and therefore may represent e.g. the test mask 24 according to FIG. 3, the test mask 224 according to FIG. 24 and the test mask 324 according to FIG. 26. The test mask 424 comprises a multilayer arrangement 476 for reflecting e.g. EUV radiation and an absorption layer 472 comprising a pinhole, which pinhole forms the diffractive test structure 426 together with the multilayer arrangement 476 in the area at the pinhole. As already explained with respect to several embodiments according to the invention a test wave 431 is generated at the diffractive test structure 426 from the measurement light 421 irradiated thereon. The correction plate 470 is arranged in the beam path of the test wave 431, i.e. in a beam path of the measurement light 421 downstream of an interaction of the measurement light 421 with the diffractive test structure 426.

The correction plate 470 in the shown embodiment is made of a transmissive material with respect to the measurement light 421 and has a varying thickness. For example the correction plate 470, in particular if configured for transmission of EUV light, may be made of a membrane of silicon (Si), silicon dioxide, silicon nitride, or zirconium having a suitable thickness variation. The correction plate 470 may be arranged substantially parallel to the test mask as shown in FIG. 27 or perpendicular to a propagation direction 432 of the test wave 431, in any case such that the thickness variation of the correction plate 470 results in an optical effect on the test wave 431, which optical effect varies in a direction transverse to the propagation direction 432 of the test wave 431.

The varying optical effect in the embodiment shown in FIG. 27 is a varying phase shift effect. This results in a phase shift effected in the light of the test wave 431 such that the wavefront of the test wave 431 is modified when the test wave 431 passes through the correction plate 424. The modification of the wavefront of the test wave 431 is effected due to optical path length differences through the correction plate 424 due to the thickness variation of the correction plate 470. The test wave 431 having passed through the correction plate 424 is referred to here with the reference numeral 431a. The test wave 431a has a further optimized wavefront, i.e. a wavefront adapted even better to the desired shape, such as the spherical shape.

In the embodiment illustrated in FIG. 27 the correction plate 424 is arranged in the far field of the test wave 431 generated by diffraction of the incoming measurement light 421 at the diffractive test structure 426. The term "far field"

in this context refers to a distance d from the diffractive test structure 426, for which distance d the Fresnel number F is smaller than one, wherein the Fresnel number F is defined as follows:

$$F = \frac{a^2}{d \cdot \lambda};$$

wherein a is the diameter of the pinhole forming the test structure and $\lambda$ is the wavelength of the measurement light 421.

Figure 28:
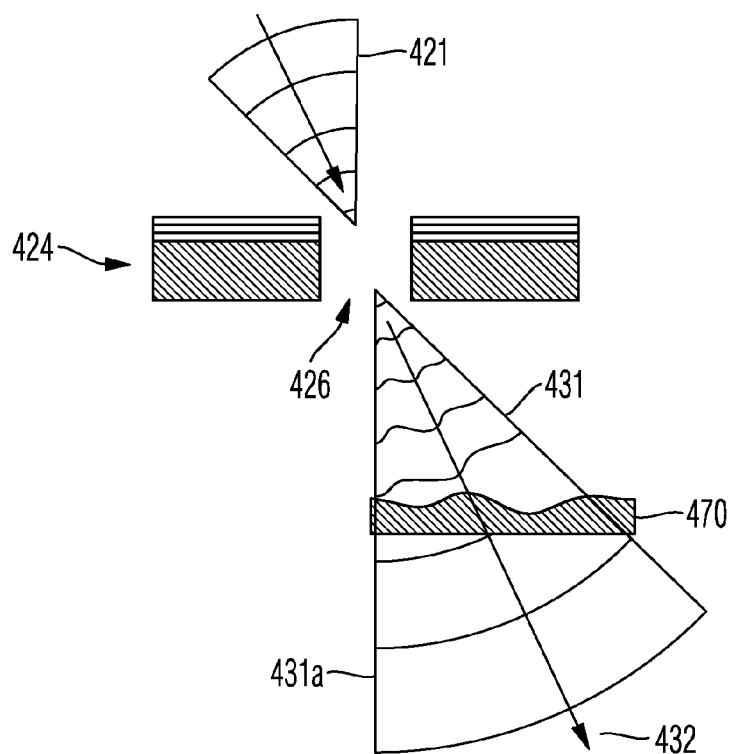
FIG. 28 shows a second embodiment of an arrangement of a test mask and a correction plate.

FIG. 28 illustrates an embodiment which differs from the embodiment according to FIG. 27 only in that the test mask 424 is configured as a transmissive mask and therefore may represent e.g. the test mask 24 according to FIG. 1 or FIG. 2, or the test mask 224 according to FIG. 23 or FIG. 25. The diffractive test structure 424 in this case is a pinhole configured as a cutout in the mask 424.

Figure 29:
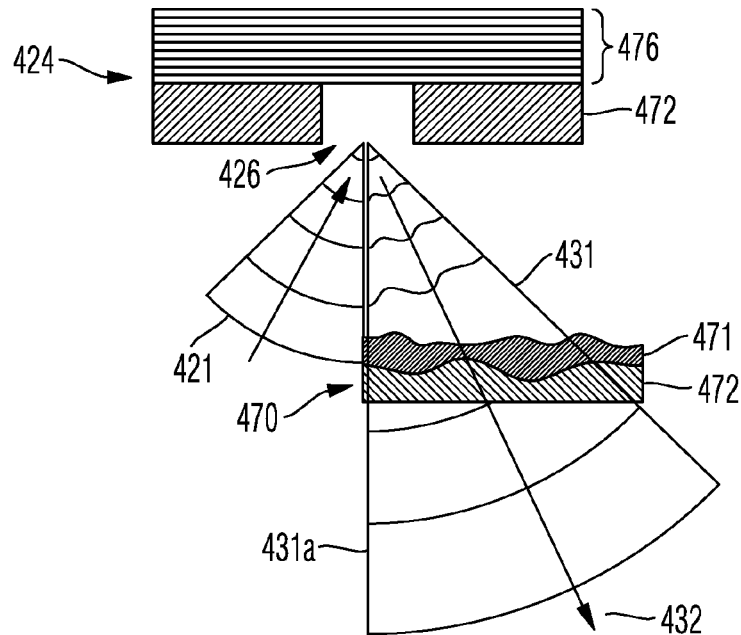
FIG. 29 shows a third embodiment of an arrangement of a test mask and a correction plate.
Figure 30:
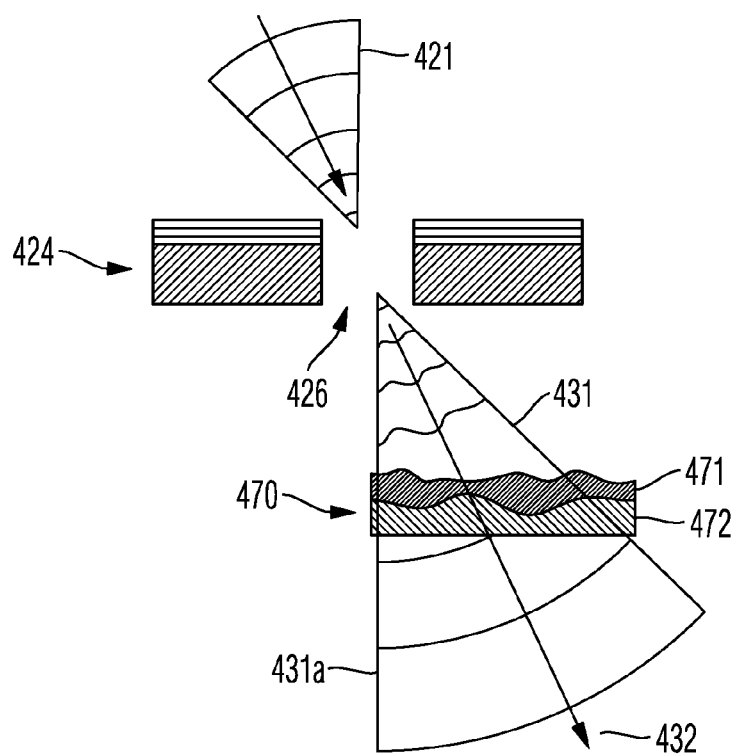
FIG. 30 shows a fourth embodiment of an arrangement of a test mask and a correction plate.

FIGS. 29 and 30 illustrate embodiments differing from the embodiments according to FIGS. 27 and 28 in that the correction plate 470 respectively comprises two transmissive layers 471 and 472. The two transmissive layers 471 and 472 are made of different materials, respectively, and each have an appropriately adapted thickness variation. The materials are chosen such that they differ both in their intensity absorption index and their refractive index defining the optical path length of the measuring light 421 of the test wave 431 through the respective layer. The materials for the layers 471 and 472 may be a combination of materials chosen from silicon, silicon dioxide, silicon nitride, or zirconium. Accordingly, the appropriately adapted thickness variation of the layers 471 and 472 results in a varying phase shift and a varying intensity attenuation effected in the light of the test wave 431, such that the test wave 413a is optimized both in its wavefront and in its intensity homogeneity. In different words, the correction plate 470 according to FIGS. 29 and 30 allows an optimization of both amplitude and phase of the resulting optimized test wave 413a.

Figure 31:
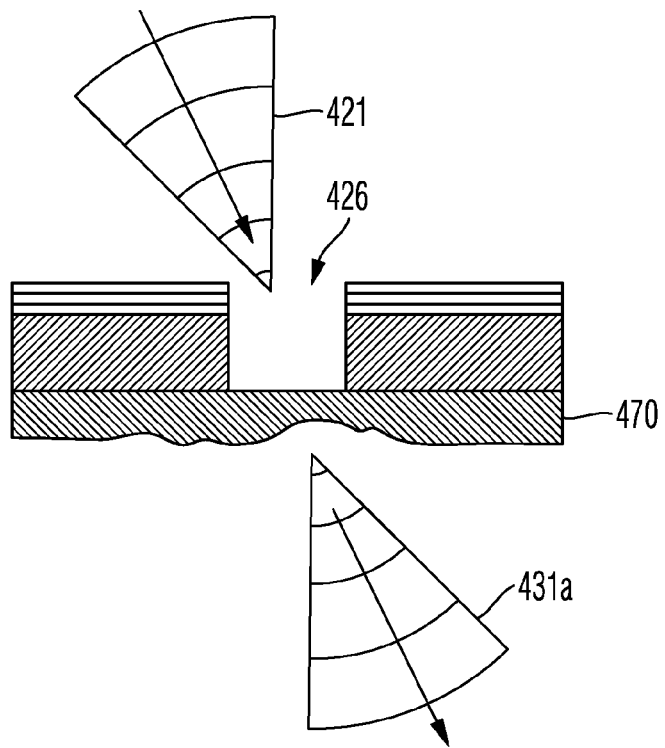
FIG. 31 shows a fifth embodiment of an arrangement of a test mask and a correction plate.
Figure 32:
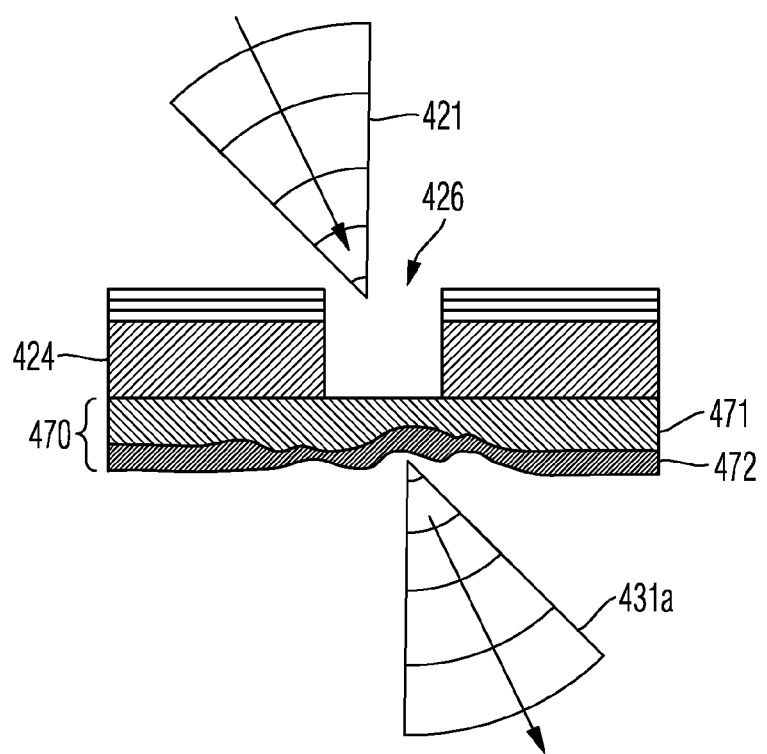
FIG. 32 shows a sixth embodiment of an arrangement of a test mask and a correction plate.

FIGS. 31 and 32 illustrate embodiments differing from the embodiments according to the FIGS. 28 and 30 in that the correction plates 470 are respectively arranged directly at the bottom side of the respective test mask 424. This is an example of the general case, according to which the correction plate 470 is arranged in the near field of the test wave 431 generated by diffraction of the incoming measuring light 421 at the diffractive test structure 426.

Figure 33:
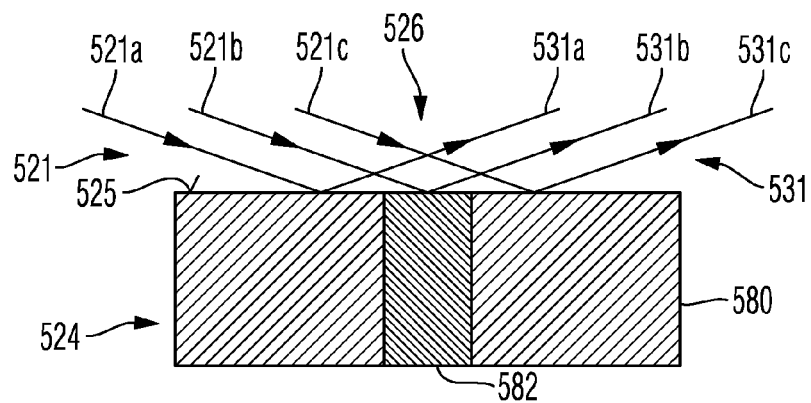
FIG. 33 shows a sectional view of a first embodiment of a test mask configured to be operated with measurement light radiated onto the test mask at grazing incidence.
Figure 34:
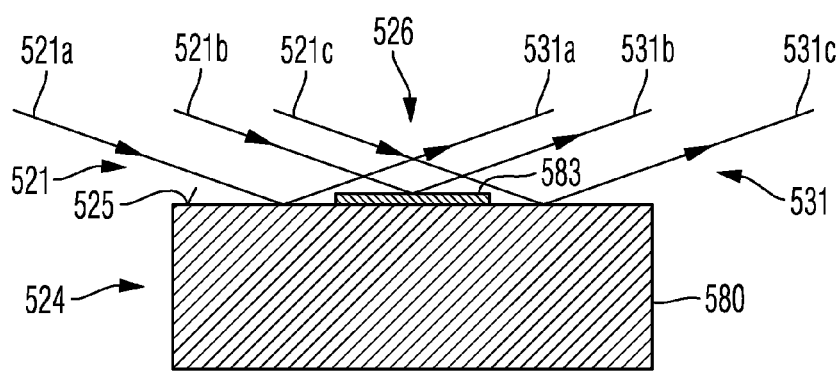
FIG. 34 shows a sectional view of a second embodiment of a test mask configured to be operated with measurement light radiated onto the test mask at grazing incidence.
Figure 35:
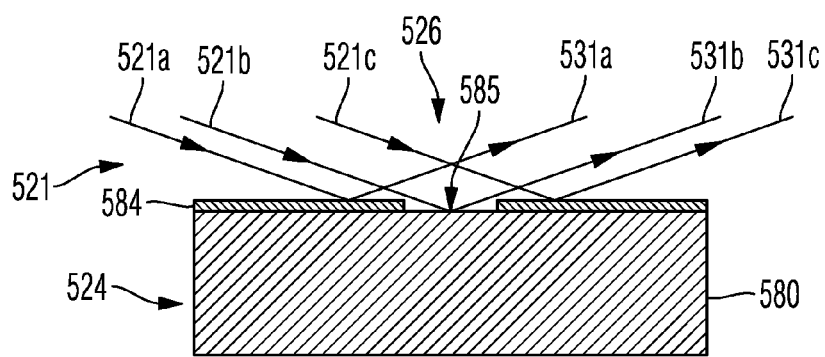
FIG. 35 shows a sectional view of a third embodiment of a test mask configured to be operated with measurement light radiated onto the test mask at grazing incidence.

FIGS. 33 to 35 show different embodiments of a reflective test mask 524 comprising a diffractive test structure 526. These embodiments may be employed as alternatives to the embodiments of a reflective test mask 24 shown in FIGS. 6 and 7. The embodiments according to FIGS. 33 to 35 differ from the embodiments according to FIGS. 6 and 7 in that they are configured for an operation in which measurement light 521 is radiated onto a mask surface 525 in grazing incidence. In contrast, the masks according to FIGS. 6 and 7 are configured for an operation, in which the measurement light is radiated onto the mask surface at a steep incidence angle.

Therefore, the measurement system 10 according to FIG. 3, the measurement system 210 according to FIG. 24 or the measurement system 310 according to FIG. 26 may be adjusted to irradiate the respective measurement light 21, 221, or 321 at grazing incidence to utilize the test mask 524 in any of the embodiments according to FIGS. 33 to 35 in place of the respective test mask 24, 24 or 324.

FIG. 33 shows an embodiment of a test mask 524 comprising a carrier layer 580 made of a first material having a low reflectivity for measurement light 521 irradiated onto the mask surface 525 under gracing incidence. The carrier layer 580 has a recess extending through the entire layer thickness, which recess is filled with an insert 582 of a second material having a high reflectivity under gracing incidence. The shape of the insert 582 may e.g. be cylindrical. The insert 582 forms together with the surface of the carrier layer 580 the surface 525 of the test mask 524, which is a flat surface. Rays 521a and 521c of the incoming measurement light 521 impinging on the carrier layer 580 are reflected to a small extent resulting in reflected rays 531a and 531c of low intensity. Ray 521b of the incoming measurement light 521 impinging on the insert 582, which forms the diffractive test structure 526, is reflected to a larger extent resulting in a reflective ray 531b of higher intensity. The rays 531a, 531b and 531c together form the test wave 531.

Figure 37:
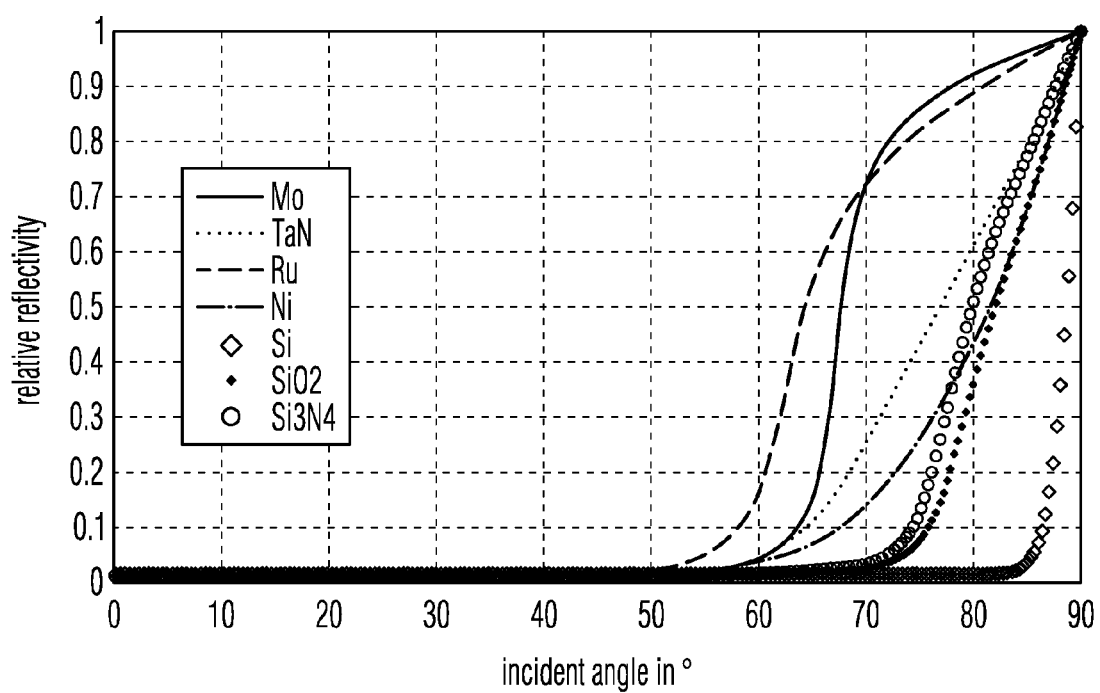
FIG. 37 shows a graph illustrating the relative reflectivity of several materials as a function of the incident angle of incoming light.

FIG. 37 shows examples of reflectivity curves for different materials as a function of the incident angle with respect of the surface normal of the test mask 524 for EUV light. The materials illustrated include molybdenum (Mo), tantalum nitride (TaN), rubidium (Ru), nitride (Ni), silicon (Si), silicon dioxide (SiO2) and silicon nitride (Si3N4). Examples for the first material of low reflectivity include Si, $SiO_2$ and $Si_3N_4$. Examples for the second material of high reflectivity are: Mo, TaN, Ru and Ni. According to an embodiment an incident angle of 70° may be chosen for the incoming measurement light 521. Si may be chosen as the first material and Mo as the second material. In this case the reflectivity for the first material is 0.006% and for the second material 71%.

FIG. 34 shows a further embodiment of a reflective test mask 524. This test mask 524 comprises a carrier layer 580 made of the first material of low reflectivity having a pad 583 arranged on its surface 525. The pad 583 forms the diffractive test structure 526 and is made of a thin layer of the second material having high reflectivity.

FIG. 35 shows a further embodiment of a reflective test mask 524. This test mask 524 comprises a carrier layer 580 made of the second material having high reflectivity and a thin top layer 584 arranged on the top surface of the carrier layer 580. The top layer 584 has a cutout 585 forming the diffractive test structure 526.

Figure 36:
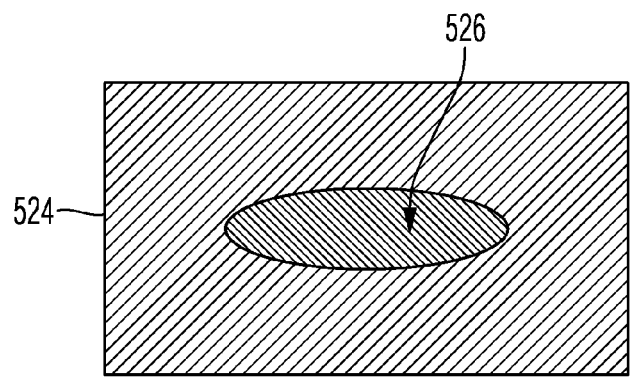
FIG. 36 shows a top down view on a test mask according to any one of FIGS. 33 to 35.

FIG. 36 illustrates a top down view on the diffractive test structure 526 according to any of the reflective test masks 524 shown in FIGS. 33 to 35. The diffractive test structure 526 is has an elongate shape in form of an elliptical shape arranged such that its long axis is aligned to the direction of incidence of the measurement light 521.

The configuration of the diffractive test structure 526 with an elongate shape allows a compensation of strong parallax effects created due to the grazing incidence of the measurement light 521. When viewing the diffractive test structure 521 configured with a round shape from the direction of incidence of the measurement light 521 the structure appears elliptical. In order to compensate this, the diffractive test structure is given the above elongate shape. According to an example the diffractive test structure is configured with an elliptical shape having an aspect ratio of 2.9:1 adapted for the measurement light 521 to impinge onto the test mask 524 at an angle of incidence of 70°.

LIST OF REFERENCE SIGNS

10 Measuring system
12 Wavefront source
14 Detector
15 Evaluation device
16 Measurement light radiating device
18 EUV source
20 Illumination optical unit 21 Measurement light
22 Mirror
22-1 Adjustable mirror
24 Test mask
26 Test structure
27 Double-headed arrow
28 Object holder
29 Object plane
30 EUV lens
31 Test wave
32 Mirror
32-1 Adjustable mirror
34 Housing
36 First incidence window
38 Second incidence window
50 Inspection apparatus
52 Substrate to be inspected
54 Surface
56 Inspection light radiating device
61 Inspection light
62 Displacement table
63 Double-headed arrow
64 Inspection detector
66 Input beam path
68 Output beam path
72 Absorption layer
74 Protective layer
76 Multilayer arrangement
78 Carrier
78 First multilayer layer
80 Second multilayer layer
82 Third multilayer layer
84 Fourth multilayer layer
87 Lens field
88 Illumination cutout
89 Illumination field
90 Focusing mirror
91 Beveled wall surface
92 Further reflective element
94 Further reflective element
95 Illumination and lens field
96 Diffusing plate
98 Absorption layer
100 Antireflection coating
102 Facing side
104 Side facing away
106 Beveled surface region
108 Membrane
110 Carrier layer
112 Reflective coating
114-1 Capture structure
114-2 Capture structure
114-3 Capture structure
114-4 Capture structure
116 Caustic curve
118 Further EUV source
120 Further illumination optical unit
122 Inspection light radiating device
130 Lens
132 Optical element
133 Pupil plane
210 Measuring system
215 Reflective multilayer stack
216 Measurement light radiation device
218 Absorption layer
221 Measurement light
224 First test mask
226 First diffractive test structure
228 Free aperture
229 Object plane
231 Test wave
$231^0$ First beam
$231^{+1}$ Second beam
$231^{-1}$ Third beam
$231_R^0$ Reference wave
$231^{+1,0}$ Test light portion
$231_R^{0,-1}$ Reference light portion
233 Wave fronts of test wave
234 Reference beam
240 Image plane
244 Second test mask
245 Reflective surface
246 Second diffractive test structure
248 Free aperture
256 Reference wave
260 Detector
262 Evaluation device
264 Diffraction grating
266 Reflective multilayer stack
310 Measuring system
312 Lens holder
315 Reflective multilayer stack
316 Measurement light radiation device
318 Absorption layer
321 Measurement light
324 Test mask
326 Diffractive test structure
329 Object plane
331 Test wave
340 Image plane
342 Light modulation device
343 Test location
344 Modulation structure
360 Detector
362 Evaluation device
421 Measurement light
424 Test mask
431 Test wave
431a Optimized test wave
432 Propagation direction of test wave
470 Correction plate
471 First transmissive layer
472 Second transmissive layer
472 Absorption layer
476 Multilayer arrangement
521 Measurement light
521a ray of incoming measurement light
521b ray of incoming measurement light
521c ray of incoming measurement light
524 Test mask
525 Surface of test mask
526 Diffractive test structure
531 Test wave
531a Reflected ray
531b Reflected ray
531c Reflected ray
580 Carrier layer
582 Insert
583 Pad
584 Top layer
585 Cutout

The invention claimed is:
1. A measuring system for measuring an imaging quality of an extreme ultraviolet (EUV) lens comprising:

a diffractive test structure contained in an absorption layer applied on a multilayer arrangement, a measurement light radiating device configured to radiate measurement light in the EUV wavelength range onto the test structure, a variation device configured to vary at least one image-determining parameter of an imaging of the test structure effected by the lens, a detector configured to record an image stack comprising a plurality of images generated with mutually differing image-determining parameters varied by the variation device, and an evaluation device configured to determine the imaging quality of the lens from the image stack.

2. The measuring system according to claim 1, wherein the test structure is part of a test mask having a reflective effect with respect to the measurement light and the test mask comprises the multilayer arrangement.

3. The measuring system according to claim 1, wherein the diffractive test structure is part of a test mask and the measurement light radiating device is configured to radiate the measurement light at grazing incidence onto the test mask.

4. The measuring system according to claim 1, further comprising:

a test mask having the test structure configured as a test structure cutout and an illumination cutout offset with respect to the test structure cutout, and a reflective element arranged at an opposing side of the test mask relative to the measurement light radiating device, said reflective element being configured to direct the measurement light through the test structure cutout after said light has passed through the illumination cutout.

5. The measuring system according to claim 4, wherein the reflective element is configured to focus the measurement light.

6. The measuring system according to claim 4, further comprising:

two further reflective elements arranged at the opposing side of the test mask relative to the measurement light radiating device such that the measurement light, after passing through the illumination cutout, is additionally deflected at the two further reflective elements before passing through the test structure cutout.

7. The measuring system according to claim 4, wherein the reflective element is configured as a diffusing plate.

8. The measuring system according to claim 4, wherein the test mask and the reflective element are provided in a mask module dimensioned as a product reticle configured for exposure in an EUV projection exposure apparatus for lithography.

9. The measuring system according to claim 1, wherein the test structure is configured as a hole structure and the evaluation device is configured to determine, for dimensioning of the hole structure, a value deviating from a real dimensioning of the hole structure utilizing an optimization calculation when determining the imaging quality of the lens.

10. The measuring system according to claim 1, further comprising a correction plate arranged in a beam path of the measurement light downstream of an interaction of the measurement light with the diffractive test structure, which correction plate is configured to have an optical effect on the measurement light, which optical effect varies in a direction transverse to a propagation direction of the measurement light at the correction plate.

11. The measuring system according to claim 10, wherein the correction plate comprises a transmissive layer having a varying thickness.

12. A measuring system for measuring an imaging quality of a lens comprising:

a lens holder configured to hold the lens, a measurement light radiating device configured to produce measurement light, a first diffractive test structure arranged on an object side of the lens when arranged in the lens holder such that a test wave is generated by diffraction of the measurement light at the first diffractive test structure, a second diffractive test structure arranged on an image side of the lens when arranged in the lens holder such that a reference wave is generated by diffraction of the measurement light at the second diffractive test structure, and a detector configured to record an interference pattern generated by superposition of light from the test wave having interacted with the lens and light from the reference wave.

13. The measuring system according to claim 12, further comprising:

a reference beam generating structure arranged on the object side of the lens when arranged in the lens holder, the reference beam generating structure being configured to form a reference beam from the measurement light and to direct the reference beam onto the second diffractive test structure.

14. The measuring system according to claim 12, further comprising:

a diffraction grating arranged in a beam path of the test wave such that the test wave is split into differently oriented beams, wherein a first of the beams is directed onto the second diffractive structure and a second of the beams is directed onto the detector to generate the interference pattern by superposition with the reference wave.

15. The measuring system according to claim 12, wherein the second diffractive test structure is configured as a light absorbing structure in a light reflecting background and the detector is arranged on the object side of the lens when arranged in the lens holder.

16. The measuring system according to claim 12, which is configured such that, with the lens arranged in the lens holder, the interference pattern is generated by superposition of light from the test wave having traversed the lens two times and light from the reference wave having traversed the lens one time after generation of the reference wave at the second diffractive structure.

17. An arrangement comprising:

an extreme ultraviolet (EUV) lens for an inspection apparatus, configured for imaging at least one section of a substrate to be inspected into a detection plane and a measuring system for measuring an image quality of the lens, said measuring system comprising:

a diffractive test structure, a measurement light radiating device configured to radiate measurement light in the EUV wavelength range onto the test structure, a variation device configured to vary at least one image-determining parameter of an imaging of the test structure effected by the lens, a detector configured to record an image stack comprising a plurality of images generated with mutually differing image-determining parameters varied by the variation device, and an evaluation device configured to determine the imaging quality of the lens from the image stack.

18. An inspection apparatus for inspecting a surface of a substrate for microlithography comprising:

an extreme ultraviolet (EUV) lens for imaging at least one section of a surface of a substrate to be inspected into a detection plane with imaging radiation, and a measuring system for measuring an imaging quality of the lens, said measuring system comprising:

a diffractive test structure, a measurement light radiating device configured to radiate measurement light in the EUV wavelength range onto the test structure, a variation device configured to vary at least one image-determining parameter of an imaging of the test structure effected by the lens, a detector configured to record an image stack comprising a plurality of images generated with mutually differing image-determining parameters varied by the variation device, and an evaluation device configured to determine the imaging quality of the lens from the image stack.

19. The inspection apparatus according to claim 18, further comprising:

an object holder configured to hold the substrate to be inspected, wherein the test structure is arranged on the object holder and the object holder is mounted to displace between an inspection position, in which the substrate to be inspected is arranged in the beam path of the measurement light, and a measurement position, in which the test structure is arranged in the beam path of the measurement light.

20. A method for measuring an imaging quality of an EUV lens comprising:

radiating measurement light in the EUV wavelength range onto a diffractive test structure contained in an absorption layer applied on a multilayer arrangement, imaging the test structure with the lens onto a detector whilst varying at least one image-determining parameter of the imaging, recording an image stack generated by the variation of the image-determining parameter, and determining the imaging quality of the lens by evaluating the image stack.

21. A method for measuring an imaging quality of a lens comprising:

radiating measurement light onto a diffractive test structure such that a test wave is generated by diffraction of the measurement light at the diffractive test structure, arranging the lens having a pupil plane in the beam path of the test wave, modulating the light intensity of the test wave at the pupil plane such that the light intensity distribution of the measurement light after having passed through the pupil plane has extremal values at several test locations, arranging a detector on an image side of the lens and recording an intensity pattern produced by the test wave having passed through the lens, and determining the imaging quality of the lens by comparing the recorded intensity pattern with a predetermined target pattern.

22. The method according to claim 21, wherein the light intensity is modulated by blocking the measurement light from passing through the pupil plane except at the test locations.

23. The method according to claim 21, wherein the light intensity is modulated by arranging a diaphragm in the pupil plane having modulation structures arranged at the test locations and the detector is arranged in a position offset from a focal plane of the lens with respect to the imaging of the diffractive test structure.

24. The measuring system according to claim 1, wherein the test structure comprises:

a carrier layer, the multilayer arrangement, which is provided over the carrier layer and comprises alternating layers of high-refractive-index and low-refractive index material, a protective layer provided over the multilayer arrangement, and the absorption layer, which is provided over the protective layer and forms a pinhole that extends from an exterior surface of the absorption layer through the absorption layer and onto the protective layer.

* * * * *